(12) United States Patent
Rothberg

(10) Patent No.: US 6,413,659 B1
(45) Date of Patent: *Jul. 2, 2002

(54) LAYERED MATERIAL HAVING PROPERTIES THAT ARE VARIABLE BY AN APPLIED ELECTRIC FIELD

(76) Inventor: Gerald M. Rothberg, 800 Castle Point Ter., Hoboken, NJ (US) 07030

( * ) Notice: Subject to any disclaimer, the term of this patent is extended or adjusted under 35 U.S.C. 154(b) by 6 days.

This patent is subject to a terminal disclaimer.

(21) Appl. No.: 09/638,766

(22) Filed: Aug. 15, 2000

Related U.S. Application Data

(63) Continuation of application No. 08/846,315, filed on Apr. 30, 1997, now Pat. No. 6,153,318.
(60) Provisional application No. 60/016,507, filed on Apr. 30, 1996.

(51) Int. Cl.$^7$ .................................................. G11B 5/66
(52) U.S. Cl. ........................................ 428/692; 257/201
(58) Field of Search .................... 438/3; 252/62.3 GA; 257/201; 428/692, 694, 336, 700, 900, 928; 365/122, 171, 174; 360/131, 135

(56) References Cited

U.S. PATENT DOCUMENTS

| | | | |
|---|---|---|---|
| 4,908,685 A | | 3/1990 | Shibasaki et al. |
| 4,928,076 A | | 5/1990 | Mourou et al. |
| 5,005,064 A | * | 4/1991 | Yoshino et al. |
| 5,046,803 A | | 9/1991 | Colak |
| 5,294,287 A | | 3/1994 | Chang et al. |
| 5,374,472 A | * | 12/1994 | Krishnan |
| 5,390,142 A | | 2/1995 | Gendlin |
| 6,153,318 A | * | 11/2000 | Rothberg |

OTHER PUBLICATIONS

Story, et al., "Carrier–Concentration–Induced Ferromagnetism in PbSnMnTe", Physical Review Letters, vol. 56, No. 7, Feb. 17, 1986.

Illegems, et al., "Optical and electrical properties of Mn–doped GaAs grown by molecular–beam epitaxy", Journal of Applied Physics, vol. 46, No. 7, Jul. 1975.

Stoffel, et al., "Magnetic First–Order Phase Transition in MnAs Films", IEEE Transactions on Magnetics, vol. Mag–6, No. 3, Sep. 1970.

Stoffel, et al., "Magneto–Optic Properties of MnAs Films", Journal of Applied Physics, vol. 41, No. 3, Mar. 1, 1970.

Van Run, et al., "An in situ grown eutectic magnetoelectric composite material", Journal of Materials Science (1974) pp. 1710–1714.

Agyei, et al., "On the Linear magnetoelectric effect", J. Phys.: Condens. Matter 2 (1990) pp. 3007–3020.

Tanaka, et al., "Molecular beam epitaxy of MnAs thin films on GaAs ", J.Vac.Sci.Technol. B 12(2), Mar./Apr. 1994.

Tanaka, et al., "Epitaxial orientation and magnetic properties of MnAs thin films grown on (001) GaAs: Template effects", Appl. Phys. Lett. 85 (15), Oct. 10, 1994.

Tanaka et al., "Epitaxial ferromagnetic MnAs thin films grown by molecular–beam epitaxy on GaAs: Structure and magnetic properties", J. Appl. Phys., vol. 76 No. 10, Nov. 15, 1994.

Park et al., Galvanomagnetic properties and magnetic domain structure of epitaxial MnAs films on GaAs (001), J. Appl. Phys. 79(8), Apr. 15, 1996.

Prinz, "Hybrid Ferromagnetic/Semiconductor Structures§", Science and Technology of Nanostructured Magnetic Materials, Edited by G.C. Hadjipanayis and G.A. Prinz, Plenum Press, New York, 1991.

Krebs, et al., "Properties of Fe single–crystal films grown on (100) GaAs by molecular–beam epitaxy", J. Appl. Phys. 61(7), Apr. 1, 1987.

\* cited by examiner

*Primary Examiner*—Charles Bowers
*Assistant Examiner*—Evan Pert
(74) *Attorney, Agent, or Firm*—Keusey, Tutunjian & Bitetto

(57) ABSTRACT

A composition of materials that is ferromagnetic and whose properties may be varied by means of an applied electric field and has at least a first and second layer. The first layer may be a substance of the formula III-V, wherein III is at least one element of Group IIIA, and V is at least one of the elements As and Sb and may include other elements of Group VA. The second layer may be a substance of the formula Mn-V, wherein V is at least one of the elements As and Sb present in the first layer. This second layer may be less than approximately 500 nm thick, but thick enough to be ferromagnetic. The first layer and said second layer may be crystalline.

23 Claims, 27 Drawing Sheets

(a)

(b)

(a)

(b)

(a)

(b)

(a)

(b)

US 6,413,659 B1

LAYERED MATERIAL HAVING PROPERTIES THAT ARE VARIABLE BY AN APPLIED ELECTRIC FIELD

CROSS REFERENCE TO RELATED APPLICATIONS

This application is a continuation of application Ser. No. 08/846,315 filed Apr. 30, 1997 now U.S. Pat. No. 6,153,318 and claims priority to Provisional Application Serial No. 60/016,507 filed Apr. 30, 1996.

FIELD OF THE INVENTION

Enitaxial MnAs and $Mn_{1-x}Ni_xAs$ thin films have been grown on semiconductors, such as GaAs (001) substrates with thicknesses of 20~200 nm. Magnetic, magneto optical and structural properties for x=0, 0.1, 0.2 and 0.3 were studied. As Ni is added to MnAs, the longitudinal magneto optical Kerr effect (MOKE, in-plane magnetization) becomes weaker and the polar Kerr effect (perpendicular magnetization) becomes distinct and disappears at x=0.3. Vibrating sample magnetometer measurements show that magnetization of the alloy film decreases linearly with Ni composition increase. X-ray diffraction results also show hexagonal and orthorhombic phases and a linear decrease of the ferromagnetic hexagonal phase fraction of the films wrath Ni composition increase. Therefore, the alloy film is considered to have a uniform distribution of hexagonal and orthorhombic phases. These results are clearly different from the bulk alloys of the same nominal compositions.

MOKE study of 20 nm MnAs/Gas thin films in perpendicular electric fields shows a decrease of Kerr signal when the substrate is at positive polarity relative to the surface. The electric field effect on the magnetization was measured using vibrating sample magnetometry (VSM) in electric fields. Electric field effects using VSM were largest in 20 MnAs films, smaller in 50 nm films and not observed in thicker films, indicating these effects arise from the substrate region of the MnAs. These films have some paramagnetic orthorhombic phase believed located in the region near the substrate. X-ray diffraction results show that the ferromagnetic hexagonal x-ray peak area decreases in both negative and positive electric field. The orthorhombic peak area does not change. Thus, the imposition of an electric field clearly either changes the phase composition or rotates the hexagonal structure from its original orientation.

BRIEF DESCRIPTION OF THE FIGURES

In FIG. 7(a), x=0. In FIG. 7(b), x=0.1. In FIG. 7(c), x=0.2. In FIG. 7(d), x=0.3.

In FIG. 11(a) point A in FIG. 10 was measured. In FIG. 11(b) point B in FIG. 10 was measured. Each data point is the average of 120 measurements.

FIG. 13(a) was measured at point A in FIG. 10. FIG. 13(b) was measured at B in FIG. 10. The Figures show distinct electric field effects.

FIG. 15(a) was measured at point A in FIG. 10. FIG. 15(b) was measured at B in FIG. 10.

FIG. 17(a) is with 50 nm MnAs/GaAs. FIG. 17(b) is with 20 nm MnHs/GaAs.

In FIG. 19(a) the sample is 20 nm MnAs unannealed. In FIG. 19(b) the sample is 20 nm MnAs annealed. In FIG. 19(c) the sample is 50 nm MnAs.

In FIG. 20(a), E=0. In FIG. 20(b), negative $E=-10^6$ V/m.

In FIG. 21(a) E=0. In FIG. 21(b), positive E=$10^6$ V/m.

FIG. 22(a) is without E—negative E. FIG. 22(b) is without E—positive E. 20 nm MnAs/GaAs (unannealed).

In FIG. 23(a), E=0. In FIG. 23(b), negative E=$-10^6$ V/m.

In FIG. 24(a), E=0. In FIG. 24(b), positive E=$10^6$ V/m.

FIG. 25(a) is without E—negative E. FIG. 25(b) is without E—positive E. 20 nm MnAs/GaAs (annealed).

SUMMARY OF THE INVENTION

Figure 1:
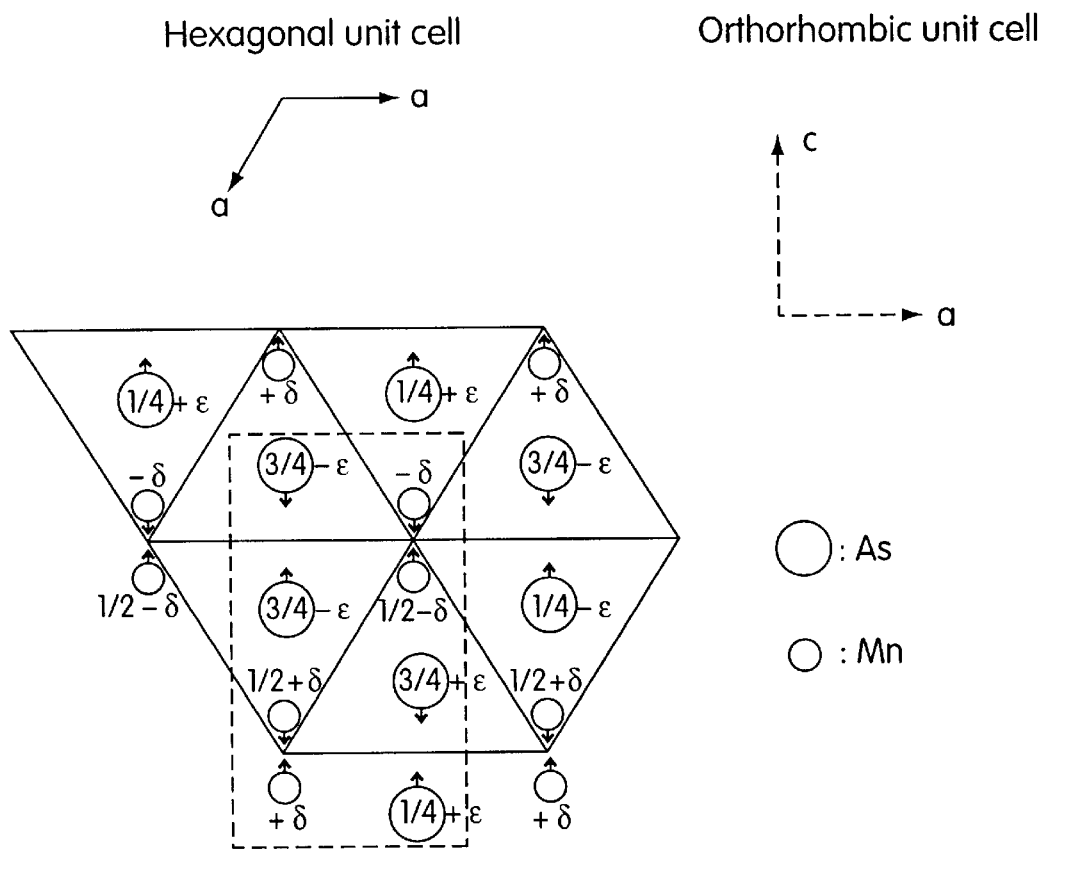
FIG. 1 provides the lattice distortions of the hexagonal structure projected along the c axis. The displacements of the Mn atoms (small circles) and nonmetal atoms(large circles) are indicated as δ and ε, respectively. The arrows indicate the directions of displacements in the a-b plane. The orthorhombic unit cell (dotted line) has lattice parameter relationship $a=a_{hex}$, $b=1.732\ a_{hex}$ and $c=c_{hex}$.

Epitaxy of ferromagnetic materials on semiconductors has attracted much interest for electro-magnetic hybrid device applications as well as magnetic thin film science. The hybrid devices utilize the combined properties of magnetics and optics or electronics. As a ferromagnetic material, MnAs is an attractive choice because it is ferromagnetic at room temperature (Tc=40° C.) and also is compatible with semiconductor substrates such as GaAs.

In the present invention MnAs and $Mn_{1-x}Ni_xAs$ thin films grown on GaAs substrates by molecular beam epitaxy were examined. The films have been found to have many unique magnetic and structural properties. For example $Mn_{1-x}Ni_xAs$ thin film has a perpendicular magnetization which can be applied to magneto optical disk materials, which is different from bulk materials (Tanaka et al. *J. Vac. Sci. Technol.* B 12, 1091 (1994)). In addition, an electric field effect on magnetization has been observed in MnAs/GaAs films.

The magnetic and structural properties of $Mn_{1-x}Ni_xAs$/GaAs have now been identified for an electric field effect on magnetization of MiAs/GaAs. A composition of materials that is ferromagnetic and whose magnetization may be varied by means of an applied electric field comprises at least a first layer of a substance of the formula III-V, wherein III is at least one element of Group IIIA, and V is at least one of the elements As and Sb and may include other elements of Group VA; and a second layer of a substance of the formula Mn-V, wherein V is at least one of the elements As and Sb present in the first layer, said second layer being less than approximately 500 nm thick but thick enough to be ferromagnetic.

DETAILED DESCRIPTION OF THE INVENTION

Ferromagnetic Thin Film Epitaxy on III-V Semiconductor

Epitaxial ferromagnetic thin films grown on semiconductors were not easily producible in the past due to lack of an epitaxial processing method for atomically smooth semiconductor surfaces and poor composition control of magnetic elements. The development of methods such as molecular beam epitaxy (MBE) has overcome such processing drawbacks, and various ferromagnetic materials have been grown on semiconductor substrates with this technique. Among several substrate material choices, III-V semiconductors like GaAs provide high speed devices and can be used in both photonic and electronic device applications.

The growth of ferromagnetic thin films is largely dependent on the strict requirements placed on them including epitaxial growth on a III-V semiconductor, thermodynamic stability of film with substrate, and morphological smoothness of film for homogeneous magnetic properties and for multilayer growth (Palmstrom, C. J. *Ann. Rev. Mater. Sci.* 389 (1995)). Though these requirements can not be satisfied simultaneously for epitaxial growth of elemental ferromagnetics such as iron or cobalt on GaAs, some metallic compounds, such as CoAl, NiAl or MnA, are more suitable as candidates for stable epitaxial thin film on III-V's.

An example of a hybrid device is a magnetic random access memory (MRAM) (Prinz, G. A. Science and Technology Nanostructure Magnetic Materials, (Plenum Press 1991), p.41). In MRAM a magnetic circuit which can represent the two bits (0 or 1) is deposited on a semiconductor substrate. A small gap is opened in the magnetic circuit and a material (Hall bar) which has a large Hall effect is deposited in the gap. By maintaining a current through the Hall bar, a voltage is generated between its upper and lower surface of the Hall bar. This generated charge can be utilized for biasing a field effect transistor (FET) channel which is installed under the magnetic circuit. Thus, in a single unit, a non-volatile memory element with semiconductor readout can be constructed.

MnAs Systems

Bulk MnAs with stoichiometric intermetallic composition (melting point of 935° C.) has a thermodynamically stable ferromagnetic phase. It has a Curie temperature of 40° C. and a magnetization, at room temperature, of ~630 emu/cm$^3$ (Bean, C. P. and Rodbell, D. S. *Phys. Rev.* 126, 104 (1962)). For comparison, ferromagnetic Fe and Ni have magnetizations of 1700 and 490 emu/cm$^3$, respectively. The structure of MnAs is hexagonal NiAs type (a-phase), with lattice constants a=0.3725 nm, c=0.5713 nm. The easy axis of magnetization is perpendicular to the c axis. At the Curie temperature, MnAs transforms from the ferromagnetic a phase to the paramagnetic b phase having a MnP-type orthorhombic structure with lattice constants a=0.366 nm, b=0.636 nm and c=0.572. In bulk MnAs, this is a first order transition with accompanying density increase of 1.86 percent and a latent heat of 1.79 cal/g (De Blois, R. W. and Rodbell, D. S. *Phys. Rev.* 130, 1347 (1963); Zieba et al. *Phys. Lett.* 91A, 243 (1982)). As shown in FIG. 1, the hexagonal to orthorhombic transition takes place with very small distortions of lattice spacings (Franzen et al. *Phys. Rev.* B. 10, 1248 (1974); Podloucky, R. *J. Mag. Mag. Mat,* 43, 204 (1984); Goodenough, J. B. and Kafalas, J. A. *Phy. Rev.* 157, 389 (1967)). At 125° C. the structure transforms again to the NiAs-type but is paramagnetic. This transition is second-order.

Bulk $Mn_{1-x}Ni_xAs$ alloys have a ferromagnetic hexagonal (NiAs-type) structure at 0<x<0.02 at room temperature (Fjellbag et al. *J. Mag. Mag. Mat.* 61, 61 (1986)). The structure is paramagnetic orthorhombic MnP-type at 0.02<x<0.25. This MnP-type structure transforms to paramagnetic NiAs-type at around 130° C. in a second order transition at the same composition. At x>0.25 the alloys again are NiAs-type but paramagnetic.

MnAs thin films with thicknesses of 20, 50, 100 and 200 nm have been grown on GaAs (001) substrates using MBE. After deposition of a 100 nm GaAs buffer layer on GaAs, two different template layers were initially grown on the buffer layer. Depending on initial growth of template layers, two different types of MnAs samples, Type A and Type B, could be obtained.

Type A: When $As_2$ flux was initially supplied on the GaAs buffer layer and MnAs was grown, the type A structure was obtained. Reflection high energy electron diffraction (RHEED) showed a disordered c(4×4), i.e., d(4×4), reconstruction of the GaAs before MnAs growth. The samples were grown on [−1100] direction and have the orientation relationships MnAs [−1−120] parallel to GaAs [110] and MnAs [0001] parallel to [−110]. The easy magnetization direction is MnAs [−1−120] parallel to GaAs [110].

Type B: After one monolayer of Mn predeposition on the buffer layer the type B sample was obtained. The RHEED pattern showed an ordered c(4×4) reconstruction. The samples have the growth directions of [−1101] and [1−102] and have the orientation relationships MnAs [−1−120] parallel to GaAs [−110] and MnAs [1−102] parallel to [110]. The easy magnetization direction is MnAs [−1−120] parallel to GaAs [−110] Notably, the easy magnetization directions of GaAs of type A and type B are 90° different with respect to the [−1−120] direction of MnAs film. This has been attributed to the difference in the atomic structure of the c(4×4) and d(4×4) reconstructions of the GaAs surface.

X-ray diffraction experiments show that the paramagnetic MnP-type MnAs phase coexists with ferromagnetic hexagonal MnAs at room temperature at an approximate ratio of 1:5. The orthorhombic MnAs phase is believed to be formed near the MnAs/GaAs interface as a means of relieving the misfit strains.

As the results of vibrating sample magnetometer measurements, the magnetization and coercive field of the MnAs films range from 300 to 600 emu/cm$^3$, and 65 to 930 Oe, respectively.

$Mn_{1-x}Ni_xAs$ films were grown on GaAs (001) substrates with compositions of x=0.1, 0.2 and 0.3 and with a thickness about 100 nm. The films have the type A structure with coexistence of hexagonal and orthorhombic phases. Magnetic and magneto optical properties were determined.

There are two primary magneto optical effects. The first is the Zeeman effect, where certain spectral emission lines of a material split into several circularly polarized components of altered wavelengths in the presence of a magnetic field. The Faraday effect, on the other hand, is exhibited as a change in the velocity and polarization state of light when it propagates through a magnetized medium. Although the two. phenomena are interrelated, the Faraday effect (along with the related Kerr effect) has attracted much interest for optical isolators and in memory applications. The Faraday effect is useful for studying transparent magnetic materials, or diluted magnetic semiconductors (Turner et al. *Appl. Opt.* 22, 3152 (1983)).

Linear Polarized Light

Unpolarized light may be changed to linearly polarized light by passing a polarizer. However, the linear polarized light may be considered to consist of two circularly polarized components, respectively, right and left circularly polarized.

$E=2E_o j \cos(kz-wt)$ for Linearly Polarized light $E_R=E_o[i \cos(kz-wt)+j \sin(kz-wt)]$ for RCP light $E_L=E_o[i \cos(kz-wt)-j \sin(kz-wt)]$ for LCP light $E=E_R+E_L$ wherein k, z, w and t are wave number, propagation direction, frequency of light, and time, respectively.

When the two circular components of the linearly polarized light are incident on a magnetic material which is placed in a magnetic field, the material shows birefringence, or, different refractive indices $n_R$ and $n_L$ corresponding to the two circular components. Then the two components of light will travel through the medium with different velocities and undergo different attenuations. Therefore, the outcoming components will have different intensities from the incident ones.

$E_R=E_o[i \cos(k_R z-wt)+j \sin(k_R z-wt)]$ for ROP light $E_L=E_o[i \cos(k_L z-wt)-j \sin(k_L z-wt)]$ for LCP light Above two altered modes recombine to yield a rotated axis of polarization and an ellipticity.

Faraday Effect

Consider an electromagnetic wave propagating in the z-direction in a birefringent medium.

$k=(2\pi n_{R/L})/\lambda_o \lambda_o$: wavelength in vacuum

At z=0, the wave is linearly polarized along the x-axis, and in the medium, the wave is given by:

$E=1/2E_o \cos(2\pi \tilde{n} z/\lambda_o-wt) [i \cos \delta/2+j \sin \delta/2]$ where $\tilde{n}=\frac{1}{2}(n_R+n_L)$ is the average refractive index, and $\delta=2\pi(n_R-n_L)/\lambda_o$ is the phase difference arising from birefringence of the medium.

After propagating a distance l, the wave is elliptically polarized with the major axis of the ellipse rotated through the Faraday angle:

$\theta_F=\delta/2=\pi l/\lambda_o(n_R+n_L)$ and with an ellipticity (ratio of the minor to the major axis):

$\Delta F=-\tan h\delta/2=-\tan h[\pi l/\lambda_o(n_R+n_L)]$

Magneto Optical Kerr Effect

In MOKE, the angle of rotation of the polarization of light reflected from a magnetic surface is measured as a function of applied magnetic field. Thus, the Kerr effect can be used to study opaque, thick ferromagnets. When linearly polarized light is reflected. It also becomes elliptically polarized with the major axis rotated by an angle (Freiser, M. J. *IEEE Trans. Mag.* Mag-4, 152 (1968); Argyres, P. N. *Phys. Rev.* 97, 334 (1955)):

$\theta K=-Im(n_R-n_L/n_R n_L-1)$ and with an ellipticity of:

$\Delta_K=-Re(n_R-n_L/n_R n_L-1)$

MOKE Configurations

Depending on the relative orientation of the magnetization, M, and the surface normal, three magneto optical Kerr effect configurations will arise. In the polar Kerr geometry, magnetization is normal to the sample surface (Martens et al. *J. Appl. Phys.* 55, 1100 (1984); Stern et al. *Phys. Rev.* 135, A1306 (1964)). The polar Kerr effect needs relatively high magnetic field because the easy magnetization axis usually lies in the sample surface plane. In the transverse Kerr geometry, magnetization is parallel to the surface but normal to the plane of incidence (Minden, H. T. *Rev. Sci. Instrum.* 63, 3290 (1992); Minden, H. T. *Rev. Sci. Instrum.* 63, 1798 (1992)). In the longitudinal Kerr effect, the magnetization is parallel to the surface in the plane of incidence (Tanaka, S. Japan. *J. Appl. Phys.* 2, 548 (1963); Judy et al. *IEEE Trans. Mag.* Mag-4, 401 (1968); Yoshino, T. and Tanaka, S. Japan. *J. Appl. Phys.* 5, 989 (1966)). Of these geometries, the longitudinal Kerr effect is favorable for the measurement of the Kerr angle since relatively small demagnetization fields are required, and a wide range of incident angles may be employed. For the measurement of maximum longitudinal Kerr effect, an angle of incidence of about 60° (pseudo-Brewster's angle; Judy, J. H. *IEEE Trans. Mag.* Mag-6, 563 (1970)) was used.

Magneto Optical Materials

There are a number of magneto optical compounds, such as rare earth (RE)-transition metal (TM) alloys, which give rise to a large Kerr angle (greater than 0.1 degree) (Gambino, R. J. and McGuire, T. R. *J. Mag. Mag. Mat,* 54, 1365 (1986); Chaudhari et al. *Appl. Phys. Lett.* 22, 337 (1973); Erkine, J. L. and Stern, E. A. *Phys. Rev.* B8, 1239 (1973)) . For a magneto optical storage application, the materials should have high thermal stability and corrosion resistance as well as suitable magnetic and magneto optical properties (Gambino, R. J. and McGuire, T. R. *J. Appl. Phys.* 57, 3906 1985)). The most interesting alloys of current use for magneto optical recording are based on the amorphous $(Tb,Gd)_x(Fe,Co)_{1-x}$ system with $0.2<x<0.3$ (Heitmann et al. *J. Appl. Phys.* 61, 3331 (1987)). Recently epitaxial ferromagnetic thin films on III-V semiconductors have been considered as promising materials for integrated magnetic optoelectronic devices. In particular, MnBi/GaAs and (Mn, Ni) Al/(Al, Ga)As with their reasonably high magneto optical Kerr angle of 0.11°~0.2°, have received much attention (Jaswal et al. *J. Appl. Phys.* 75, 6346 (1994). MnAs/GaAs shows the Kerr angle up to 0.4° and could be used as a real magneto optical material applications.

Magnetism of Epitaxial $Mn_{1-x}Ni_xAs$ MBE Films on GaAs (001)

Epitaxial ferromagnetic thin films on semiconductors have recently attracted much interest. The possibility of incorporating these materials into integrated circuit devices is being studied (Blundell et al. *J. Appl. Phys.* 73, 5948 (1993); De Boeck et al. *J. Appl. Phys.* 76, 6281 (1994); Krebs et al. *J. Appl. Phys.* 61, 2596 (1987)). The manganese-based metallic compounds are one of the materials of interest for such applications (Harbison et al. *J. Cryst. Growth* 127, 650 (1993)). It has been reported that the structural and magnetic properties of (MnNi)Al alloy thin films on GaAs can be precisely controlled by Ni addition to the alloy (Harbison et al. *Solid State Electron* 37, 1031 (1994)). These materials have been shown to exhibit perpendicular magnetization, a property highly desirable for such applications as high density memories.

The properties of $Mn_{1-x}Ni_xAs$ films grown on GaAs (001) substrates have also now been determined. These epitaxial films of the present invention have been shown to possess both in-plane and perpendicular magnetization at Ni concentrations up to x=0.2 and have a mixed structure of hexagonal NiAs and orthorhombic MnP types. In contrast, bulk $Mn_{1-x}Ni_xAs$ alloys are paramagnetic at x>0.02 and have a MnP-type structure at 0.25>x>0.0210. Accordingly, the magnetic behavior of the epitaxial films of the present invention is quite unlike that of bulk material with the same nominal composition.

The Electric Field Effect on Magnetization of MnAs

Heteroepitaxial ferromagnetic thin films prepared by molecular beam epitaxy (MBE) on III-V semiconductor substrates have been studied for use in hybrid devices combining magnetic, electronic and optical properties (Blundell et al. *J. Appl. Phys.* 73, 5948 (1993); Krebs et al. *J. Appl. Phys.* 61, 2596 (1987); Sands et al. *Appl. Phys. Lett.* 57, 2609 (1990)). An example of a hybrid device, a diluted magnetic semiconductor (DMS), in which magnetic ions were implanted uses the exchange interaction between semiconductor carriers and localized magnetic ions to alter the transport, optical, magnetic properties of the semiconductor. On GaAs substrate, ferromagnetic Fe, MnAl, MnGa and MnNiAl deposited have been reported (Krebs et al. *J. Appl. Phys.* 61, 2596 (1987) ; Sands et al. *Appl. Phys. Lett.* 57, 2609 (1990); Sands et al. *J. Appl. Phys.* 73, 6399 (1993)).

In the present invention ferromagnetic MnAs and $Mn_{1-x}Ni_xAs$ thin films on GaAs have been grown by MBE. The effect of electric field on magneto optical Kerr effect (MOKE) of MnAs/GaAs and the change of magnetization of the samples under electric fields of these films was examined.

Compositions wherein x=0.1, 0.2, 0.3 with thickness about 100 nm were examined. In the magneto optical Kerr effect it was observed that $Mn_{0.9}Ni_{0.1}As$ has in-plane magnetization (longitudinal Kerr effect, rotation angle ~0.05 degree above 1000 Oe) and also a distinct perpendicular magnetization (polar Kerr effect). For x=0.2, the polar Kerr effect is weaker than for x=0.1 but still distinct and the longitudinal Kerr effect is also reduced. At x=0.3 both the polar and longitudinal Kerr effects are undetectable. Vibrating sample magnetometer measurements show linear dependence of magnetization on Ni concentration, which agrees with X-ray diffraction data indicating a gradual transition from hexagonal to orthorhombic structure. In contrast, bulk $Mn_{1-x}Ni_xAs$ alloys at 300° K are paramagnetic and orthorhombic for x>0.02 and transform to a hexagonal phase at x=0.22.6 Therefore, the behavior of these alloy films is quite different from bulk material of the same nominal composition.

Figure 7:
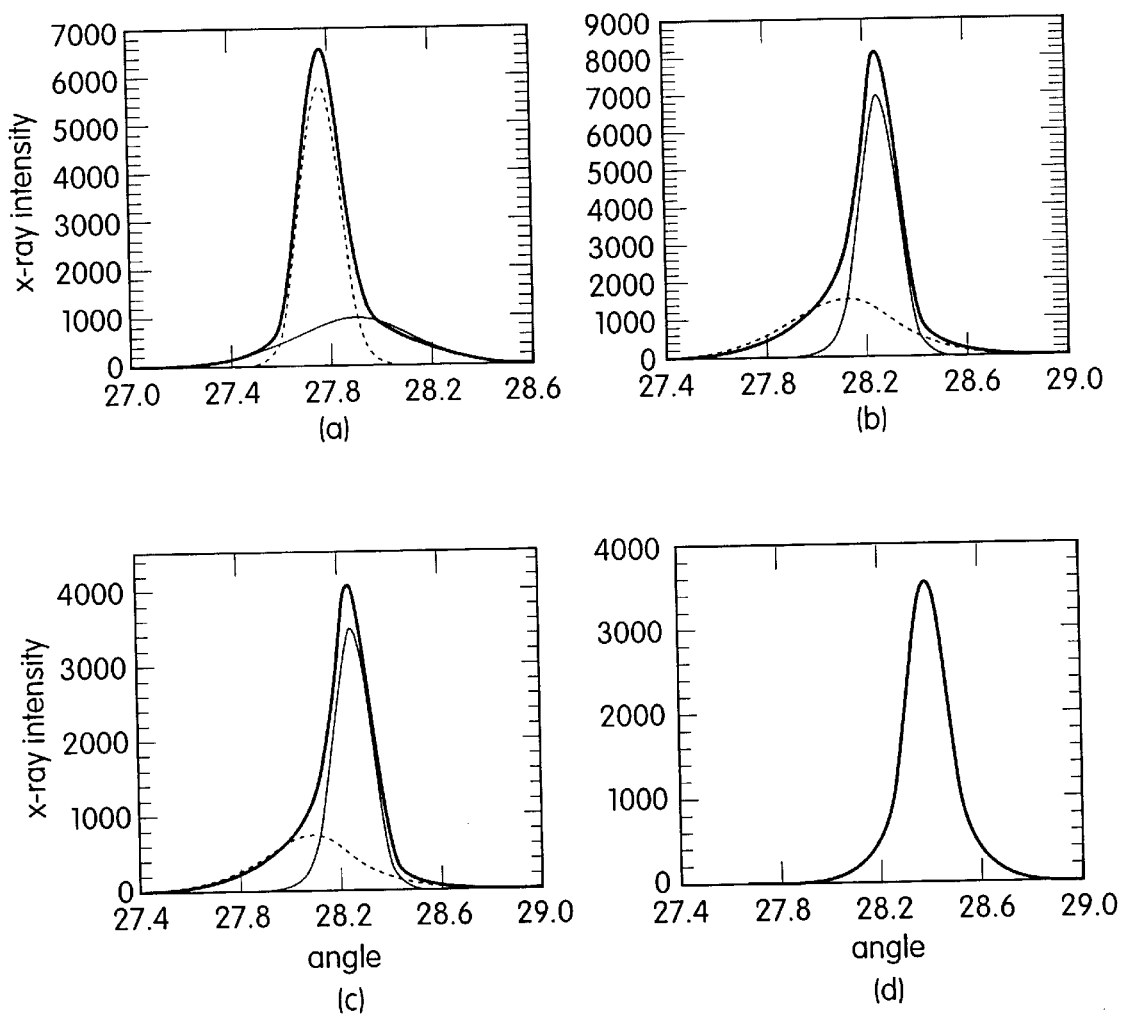
FIG. 7 shows room temperature x-ray spectra of $Mn_{1-x}Ni_xAs$ thin films. Dotted lines are Pearson-type fitted curves. The left peak corresponds to the hexagonal structure and right one to the orthorhombic structure. As Ni concentration increases, the whole peak shifts to the right side and decreases in magnitude.

FIG. 7 illustrates x-ray diffraction results from pure MnAs and alloys. With an increase in Ni it can be seen that the peak not only decreases in intensity but also shifts in angular position by almost 0.14 degrees. The peak can be resolved into two components, which in the case of x=0, i.e., pure MnAs, corresponds to the (−1100) reflection from the hexagonal NiAs type and the (002) reflection from the orthorhombic MnP type structures. Formation of similar structures when x does not equal zero are assumed, thus making it possible to correlate magnetization with film composition. Lattice parameters b>c>a for the orthorhombic structure and identification of the x-ray. peak as (020) have been performed. In this embodiment, c>a>b, which makes the peak (002). This choice facilitates comparison with the results on the structure of the bulk alloys. The NiAs type peak of MnAs (left dotted line in FIG. 7(*a*)) changes to the MnP type peak (right dotted line) and shifts to higher angles as Ni is added to the alloy.

Figure 8:
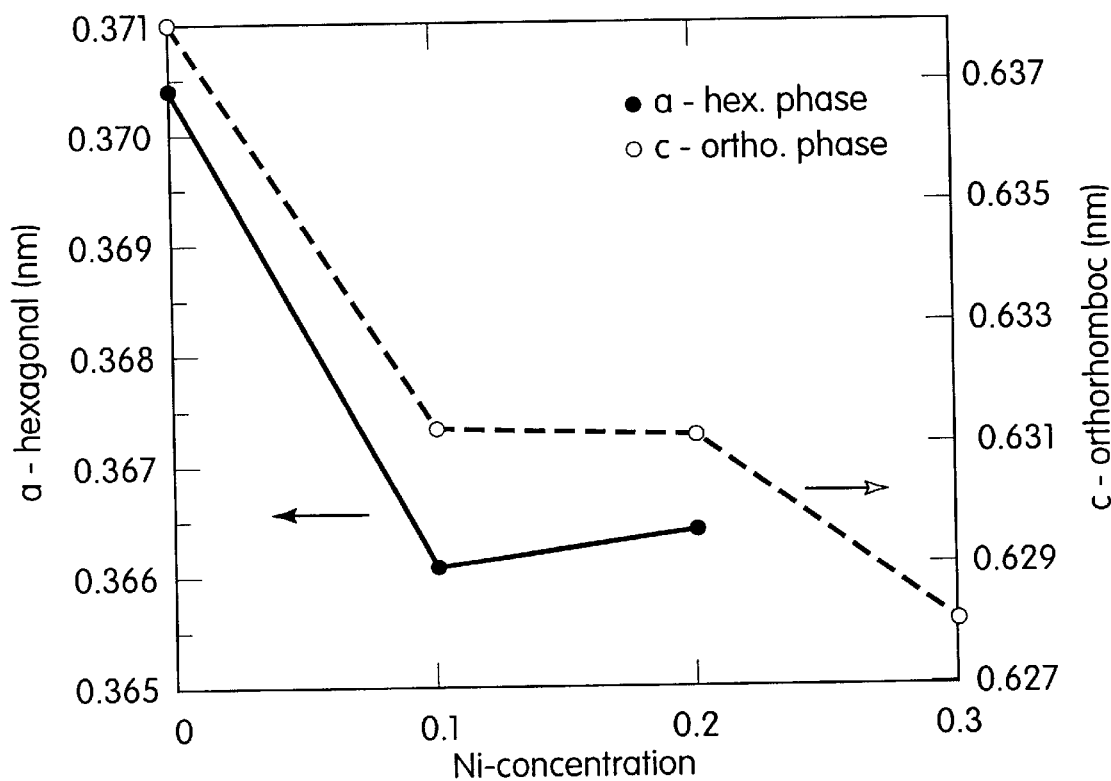
FIG. 8 shows the dependence of lattice parameters of hexagonal and orthorhombic structures on Ni concentration wherein a=lattice parameter of hexagonal (c>a), and b=lattice parameter of orthorhombic (b>c>a).

In FIG. 8, the d-spacings of these reflecting planes are shown as Ni concentration increases. The d-spacings correspond to the basal plane lattice parameter a in the hexagonal structure and the parameter c in the orthorhombic structure. The bulk alloy is hexagonal and ferromagnetic to x equals 0.02, where it becomes orthorhombic and paramagnetic. The orthorhombic d-spacing does not change with Ni concentration up to about 0.22, where the phase changes to, hexagonal again, but paramagnetic. At x equals 0.1 and 0.2, the orthorhombic fraction in these films shows constant d-spacing as do the bulk alloys. In contrast, the $Mn_{0.7}Ni_{0.3}As$ thin film shows the pure MnP structure with a further reduction of d-spacing.

Figure 9A:
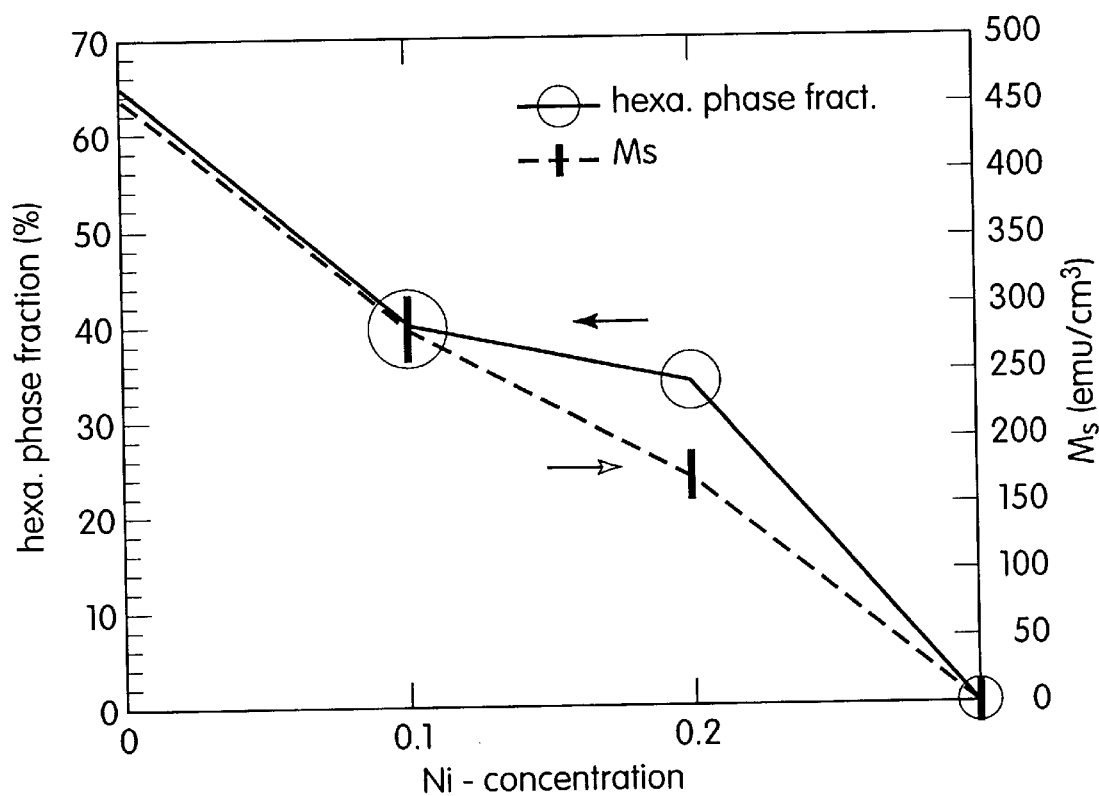
FIGS. 9A through 9C show Ni concentration dependence of: (a) saturation magnetization Ms and hexagonal phase fraction; (b) coercivity and longitudinal MOKE signal of the epitaxial $Mn_{1-x}Ni_xAs$ thin films on GaAs(001) at room temperature; and (c) linear dependence of magnetization on hexagonal phase fraction. The size of the data point indicates the standard deviation.
Figure 9B:
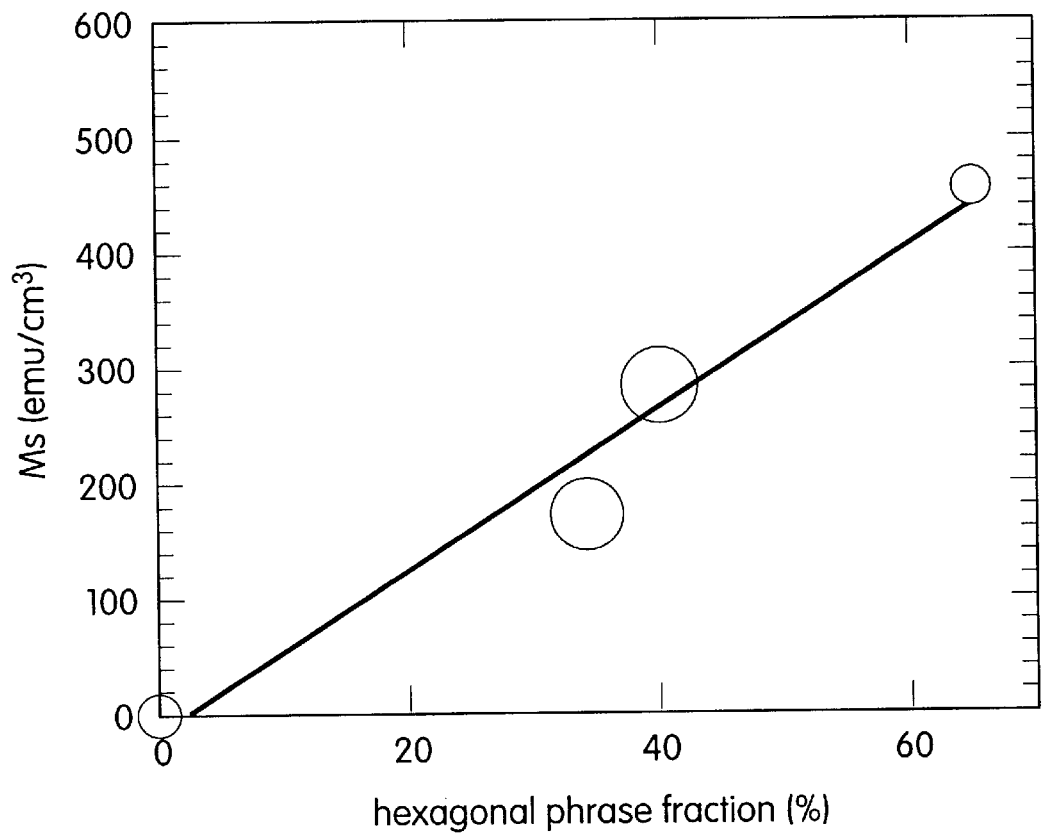
Figure 9C:
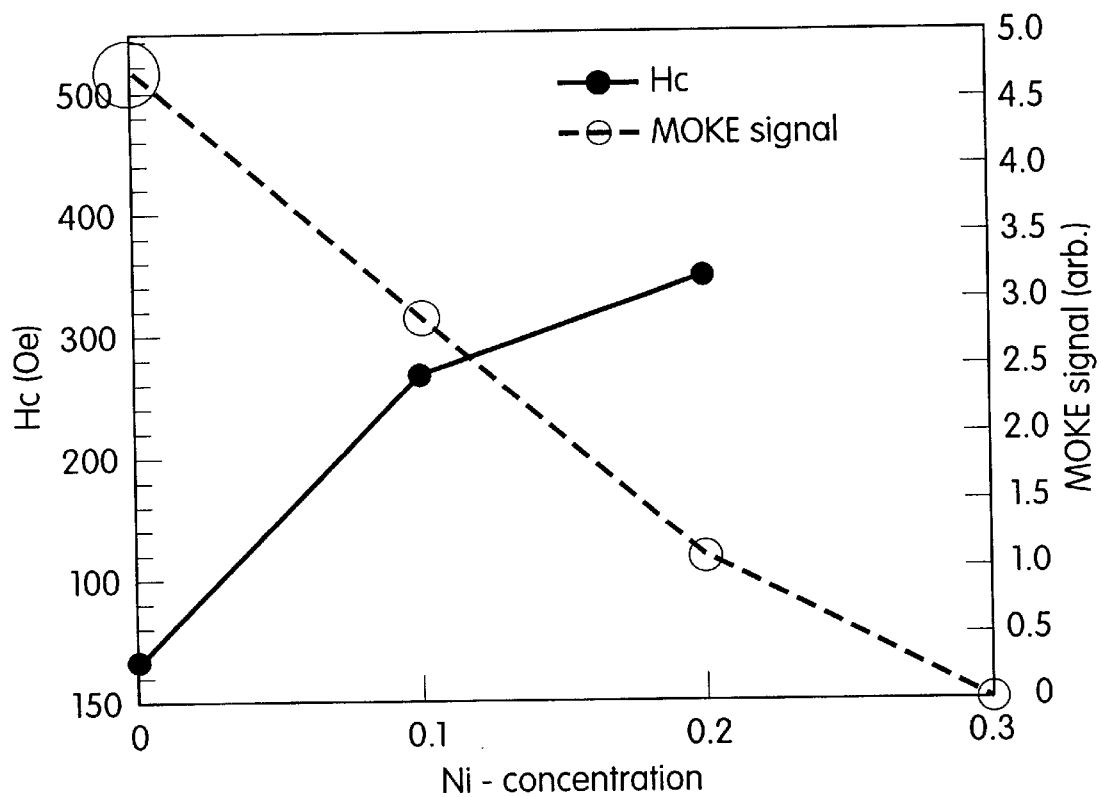

The composition dependence of the saturation magnetization Ms and the coercivity Hc of the $Mn_{1-x}Ni_xAs$ epitaxial thin films, acquired using the VSM, are shown in FIG. 9. FIG. 9(*c*) also shows for comparison the maximum (1400 Oe) longitudinal MOKE versus composition. The magnetization of the films is found to decrease linearly with increase in Ni concentration. Notably, FIG. 9(*b*) shows a linear dependence of Ms on the hexagonal phase fraction, which is determined by calculation of relative areas of the component curves of FIG. 7. Thus the films show the same dependence of magnetization on crystal symmetry as do the bulk alloys. At $Mn_{0.7}Ni_{0.3}As$ the in-plane magnetization has disappeared, whereas in the bulk alloys the magnetization vanishes at x greater than about 0.02. With regard to perpendicular magnetization, the VSM showed it is weak in all the alloys. The polar Kerr effect proved to be more sensitive and showed that pure MnAs exhibits little or zero perpendicular magnetization at 1400 Oe. $Mn_{0.9}Ni_{0.1}As$ possesses a distinct perpendicular component that saturates at about 1200 Oe. This component is further attenuated in the x equals 0.2 alloy and saturates at about 400 Oe. When x equals 0.3, the perpendicular component of magnetization is undetectable. FIG. 9(c) shows the dependence on Ni concentration of the maximum (1400 Oe) longitudinal Kerr signal. Using an ellipsometer the index of refraction was found to be 2.47(1) for x equals 0. For x equals 0.1, it is 2.71(1). The MOKE signal is inversely proportional to index squared, causing a reduction of 20 percent from x equals 0 to 0.1. If the index of refraction continues to increase as x increases, this increase and the decrease in magnetization can account for the decrease in MOKE signal shown in FIG. 9(c). This behavior implies that the mixture of hexagonal and orthorhombic phases is uniform in the MOKE sampling depth, which is about 22 nm. This observation plus the linear variation of magnetization, which is a property of the entire film, imply further that the entire film is uniform. If the index is approximately instant, which is unlikely, the implication is that the fraction of orthorhombic phase is larger near the top surface of e films. Both of these phase distributions contrast with results on the structure of pure MnAs films, wherein some orthorhombic phase was found located near the GaAs substrate.

The longitudinal and polar magneto cotical Kerr effects were determined. Pure MnAs has in-plane (longitudinal Kerr effect), square-shaped magnetization but very weak perpendicular (polar Kerr effect) magnetizazion in the applied fields, less than 1400 Oe. The longitudinal Kerr angle of pure MnAs saturates above 400 Oe at about 0.25°. $Mn_{0.9}Ni_{0.1}$ as shown both in-plane and perpendicular magnetization, and a longitudinal Kerr angle about 0.05° above 1000 Oe. When the Ni concentration is increased to 0.2, the polar Kerr effect becomes weaker, as does the longitudinal Kerr effect. For $Mn_{0.7}Ni_{0.3}As$, both the polar and the longitudinal Kerr effects are undetectable.

Accordingly, it has been shown that pure MnAs films have little or zero perpendicular magnetization, though when Ni is added to the alloy a perpendicular component is clearly observed and is found to decrease from x equals 0.1 to 0.3. Contrary to bulk material, where for x of 0.1 to 0.3 the alloys are found to be paramagnetic and to change to the hexagonal NiAs structure from the orthorhombic MnP one, at x equal 0.22 the alloy films of the same compositions exhibit markedly different magnetic characteristics and structures, being ferromagnetic below x equals 0.3 and showing a linear change with x from ferromagnetic hexagonal to paramagnetic orthorhombic.

Several thicknesses (20, 50, 100 and 200 nm) of MnAs thin films were also grown on GaAs substrates by molecular beam epitaxy (MBE). The magneto optical Kerr effect (MOKE) of the 20 nm MnAs samples decreases by about 4 percent when a negative electric field is applied to the sample. The refractive index of the 20 nm MnAs increases by about 1 percent when a positive electric field is applied. Magnetization measurements using a vibrating sample magnetometer (VSM) also show a decrease of magnetization by about 3.5 percent in both positive and negative electric fields. Therefore, the electric field effect on MOKE of the 20 nm MnAs in negative electric field can be attributed to the reduction of magnetization of the samples. This reduction of magnetization might come from the decrease of ferromagnetic hexagonal phase, or the rotation of hexagonal structure from its original orientation, as indicated by x-ray diffraction.

Figure 10:
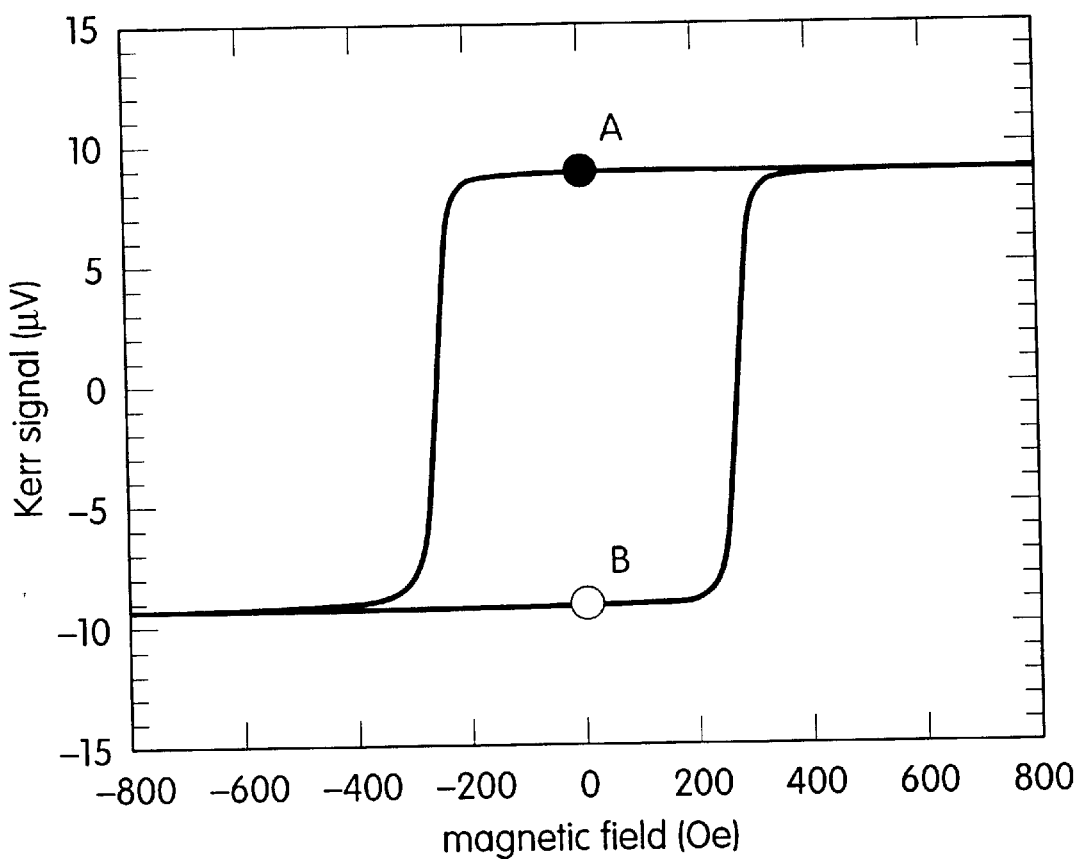
FIG. 10 provides a MOKE hysteresis curve of 200 nm MnAs/GaAs. Points A and B correspond to H=0 but remandment magnetization in opposite directions. Kerr angle ~0.4 degrees.
Figure 11:
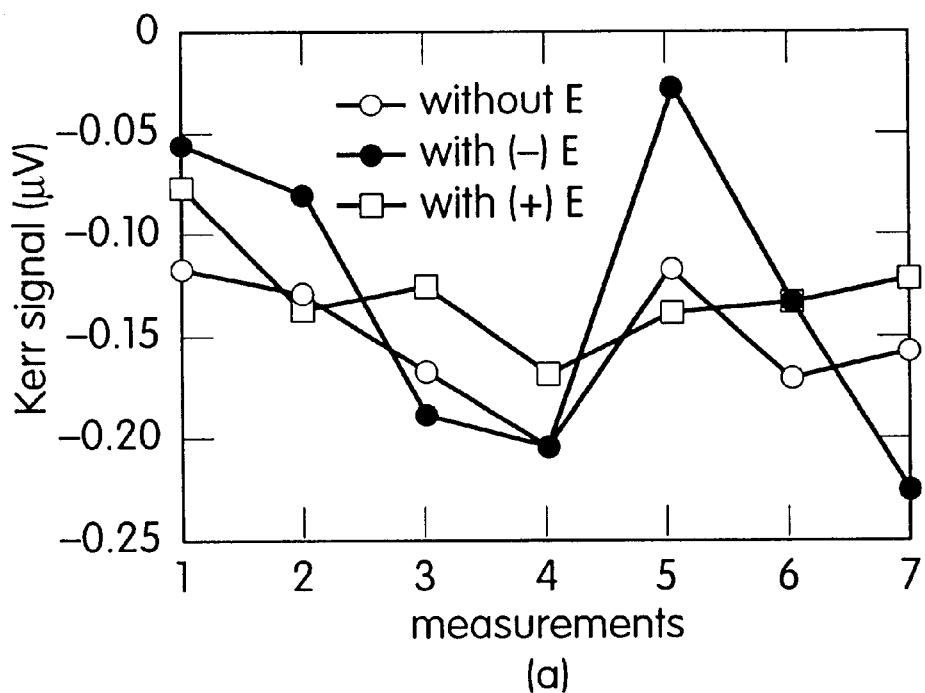
FIG. 11 shows a comparison of MOKE signals of 200 nm MnAs/GaAs measured under positive and negative electric fields ($10^6$ v/m) at H=0 of 200 nm MnAs/GaAs.
Figure 11:
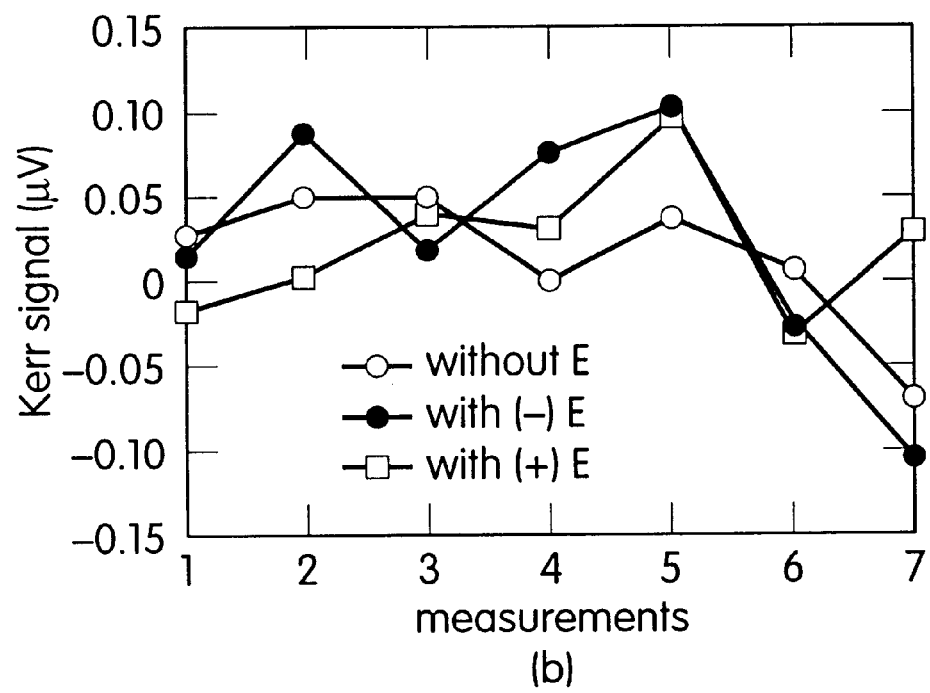
Figure 12:
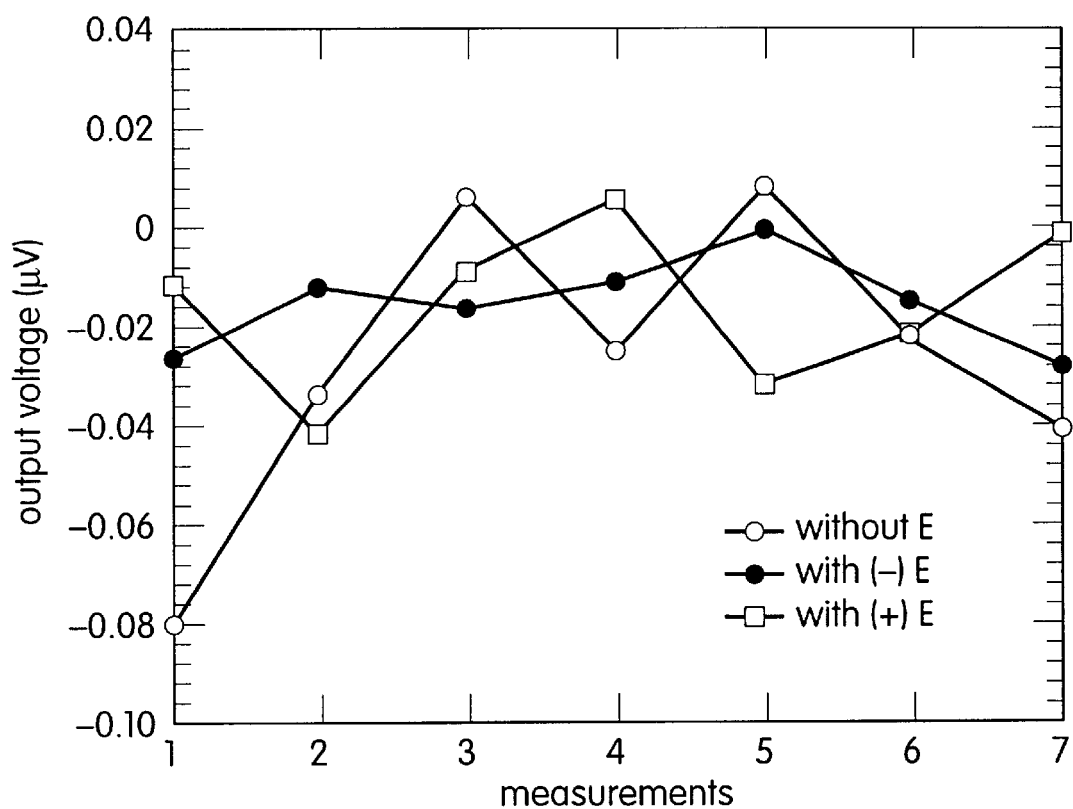
FIG. 12 provides a comparison of MOKE signals of pure GaAs measured under positive and negative electric fields ($10^6$ V/m).
Figure 13:
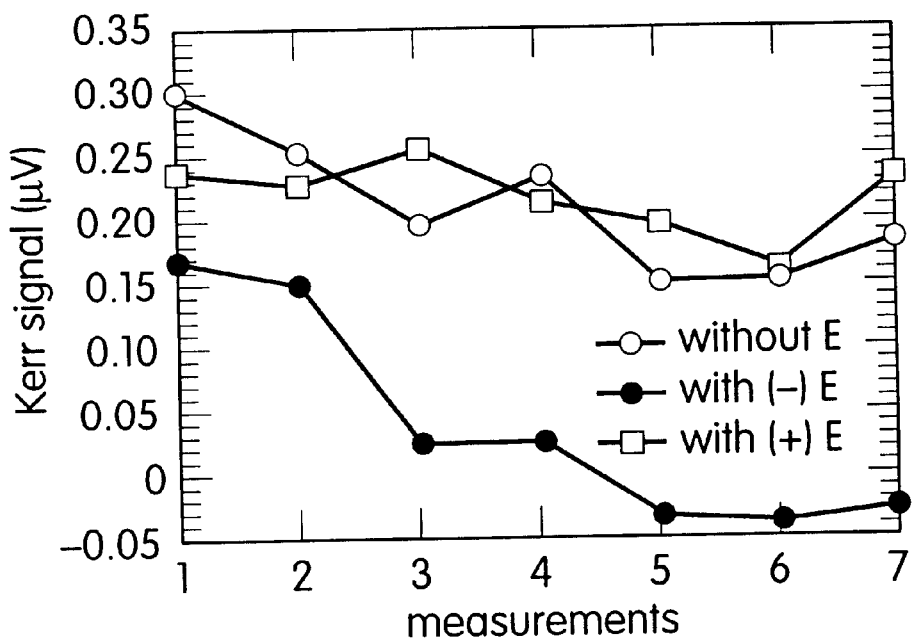
FIG. 13 provides a comparison of MOKE signals of 20 nm MnAs/GaAs (unannealed) measured under positive and negative electric fields ($2 \times 10^4$ V/m) at H=0.
Figure 13:
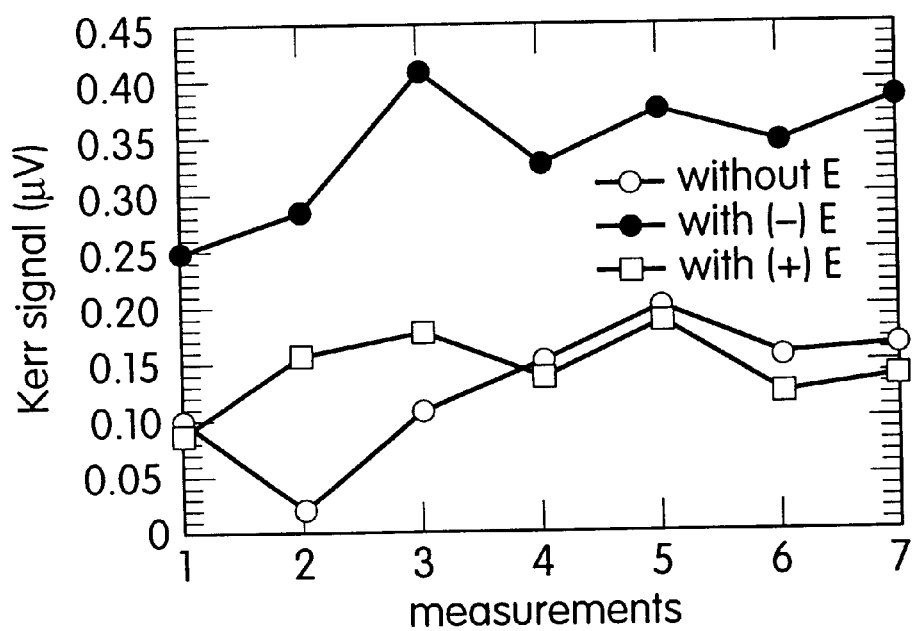
Figure 14:
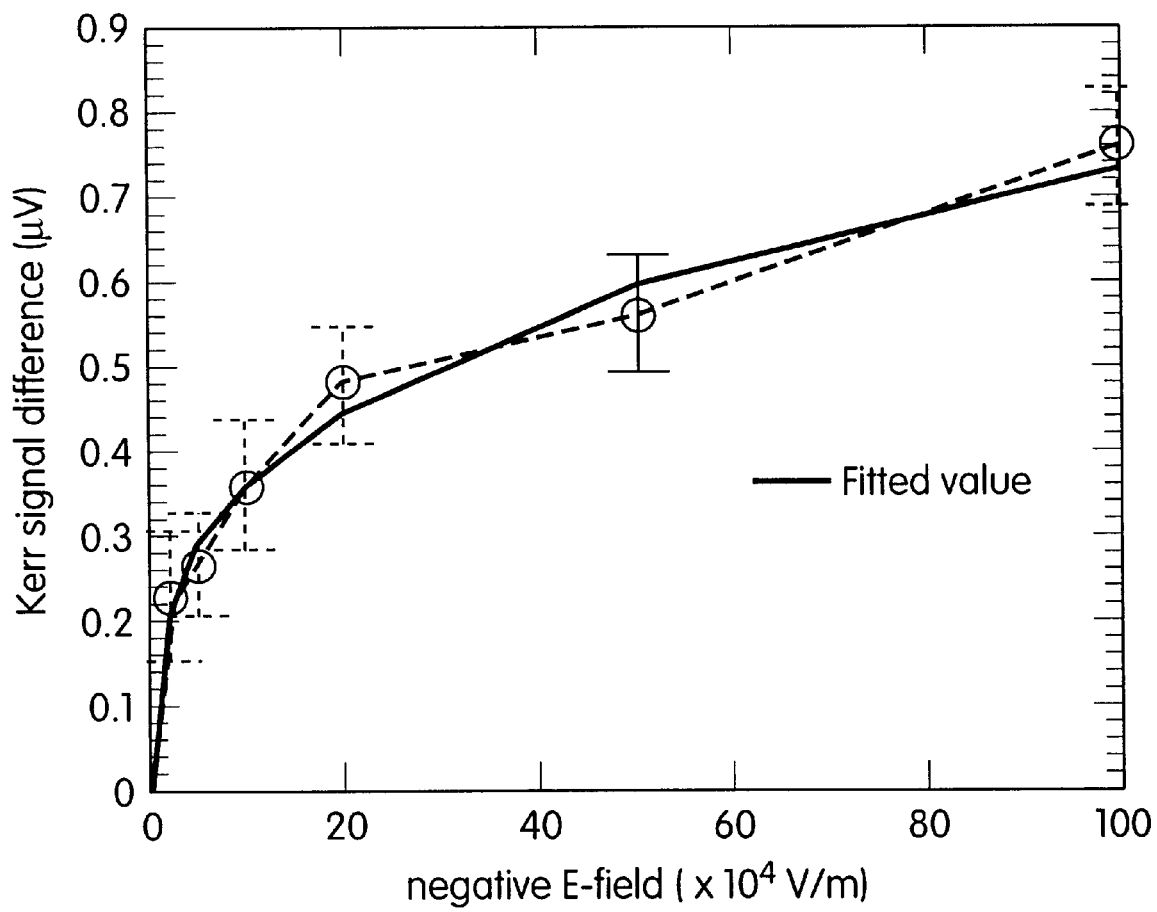
FIG. 14 shows the dependence of MOKE on applied negative electric field (x) with 20 nm MnAs/GaAs (unannealed) wherein $y=ax^b$, a=0.16 and b=0.35.
Figure 15:
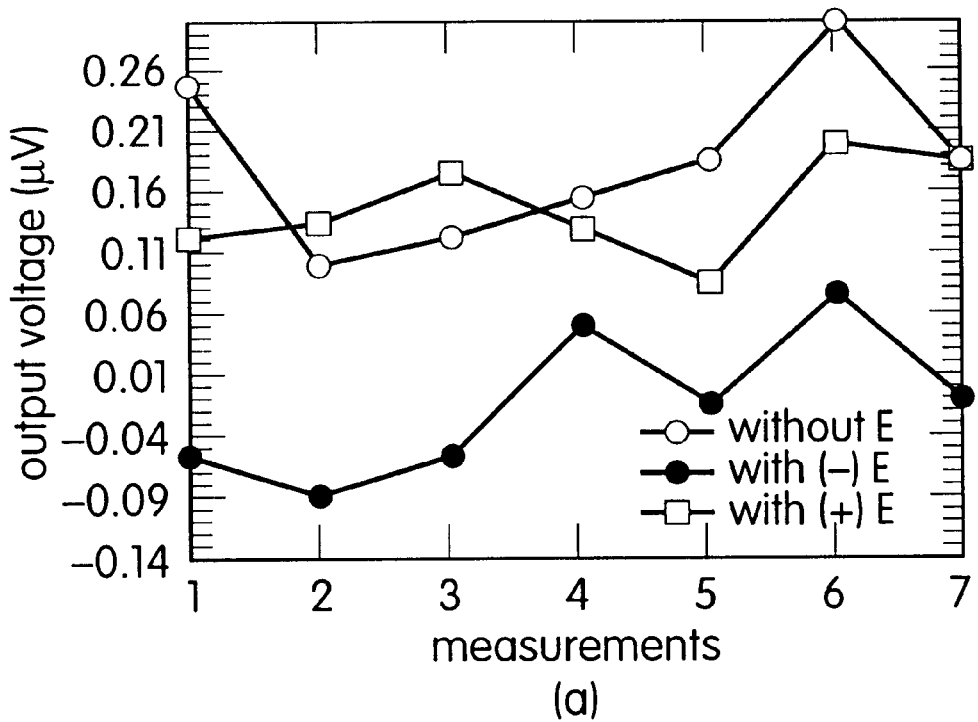
FIG. 15 shows a comparison of MOKE signals of 20 nm MnAs/GaAs (annealed) measured under electric fields ($2 \times 10^4$ V/m) at H=0.
Figure 15:
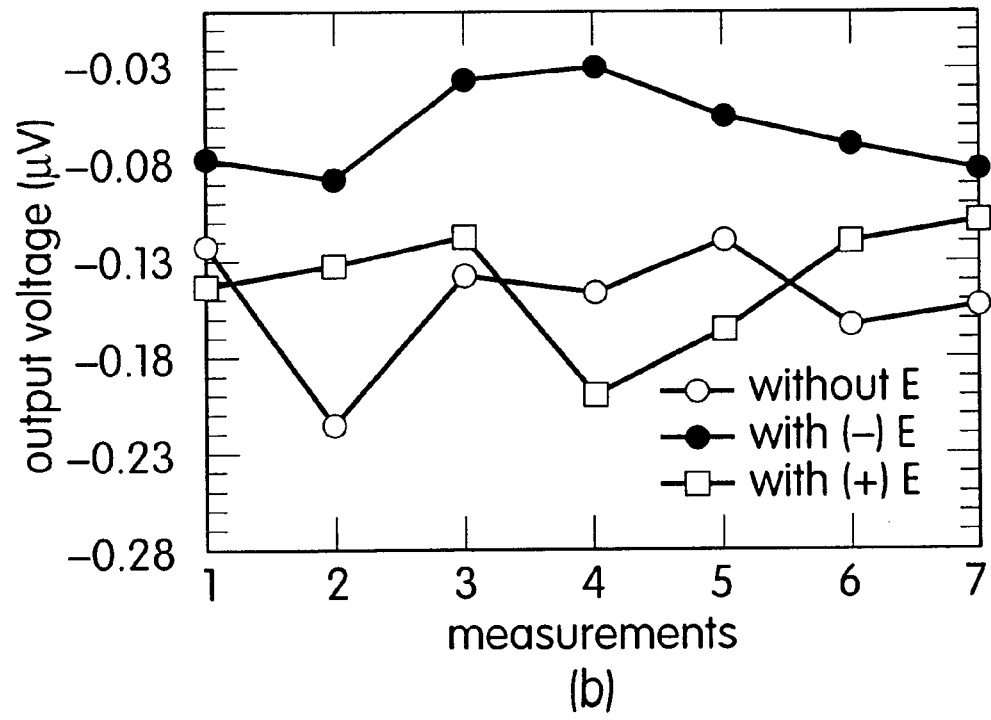
Figure 16:
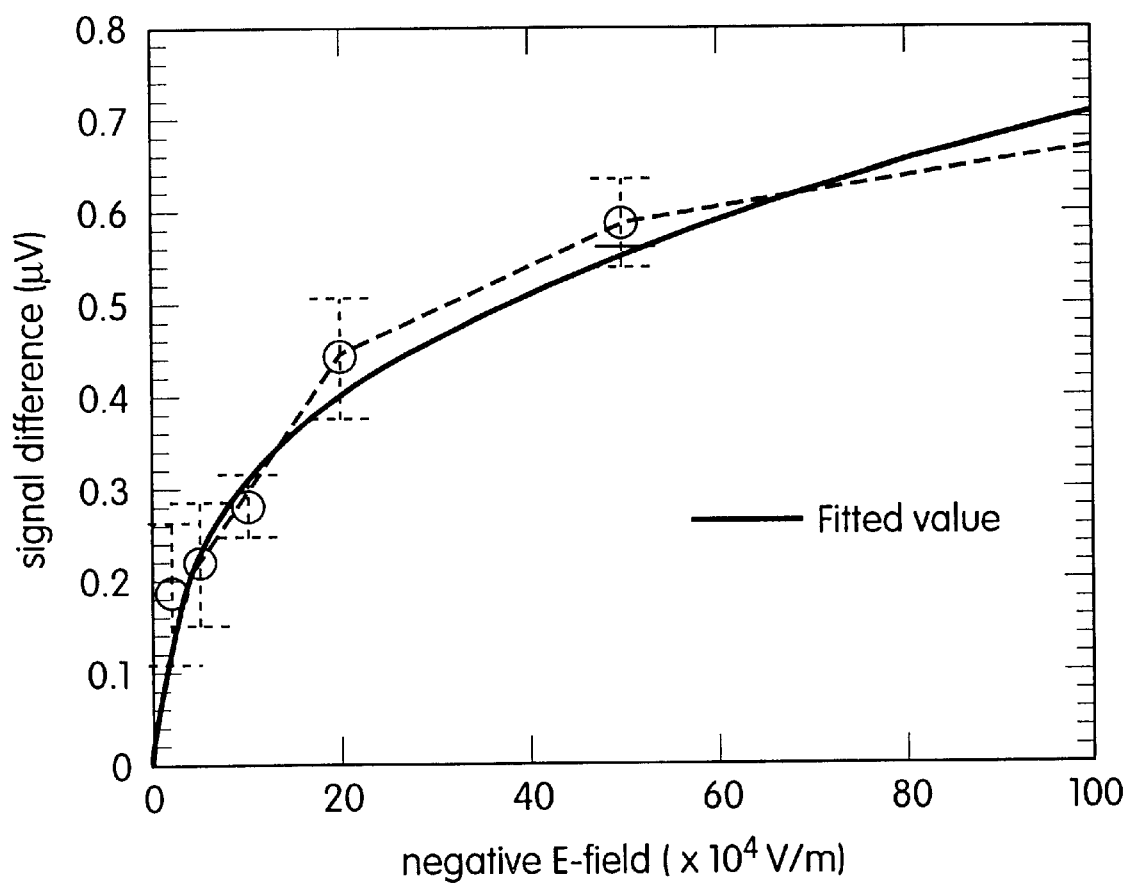
FIG. 16 shows the dependence of MOKE on applied negative electric field (x) with 20 nm MnAs/GaAs (annealed) wherein $y=ax^b$, a=0.18 and b=0.34.
Figure 17:
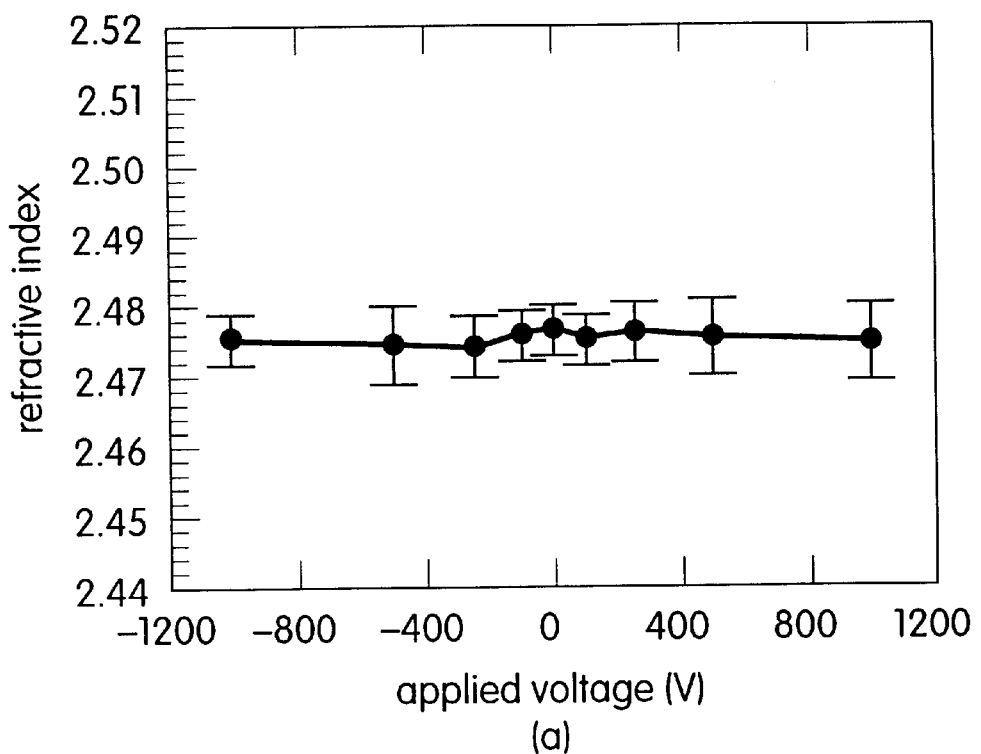
FIG. 17 shows a change of index of refraction with electric fields.
Figure 17:
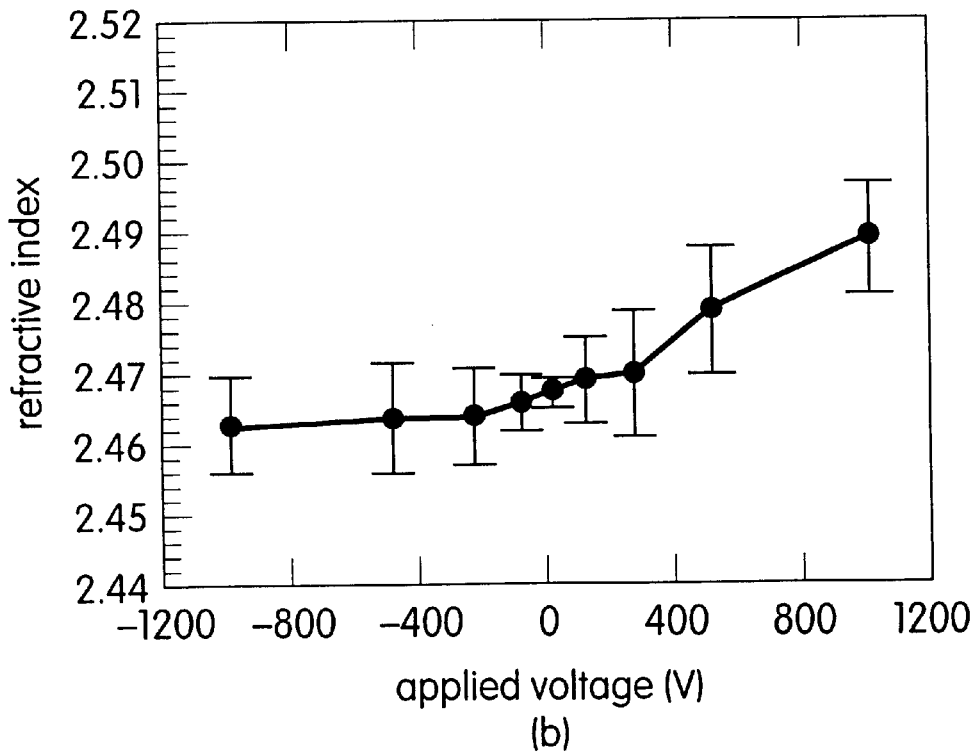
Figure 19:
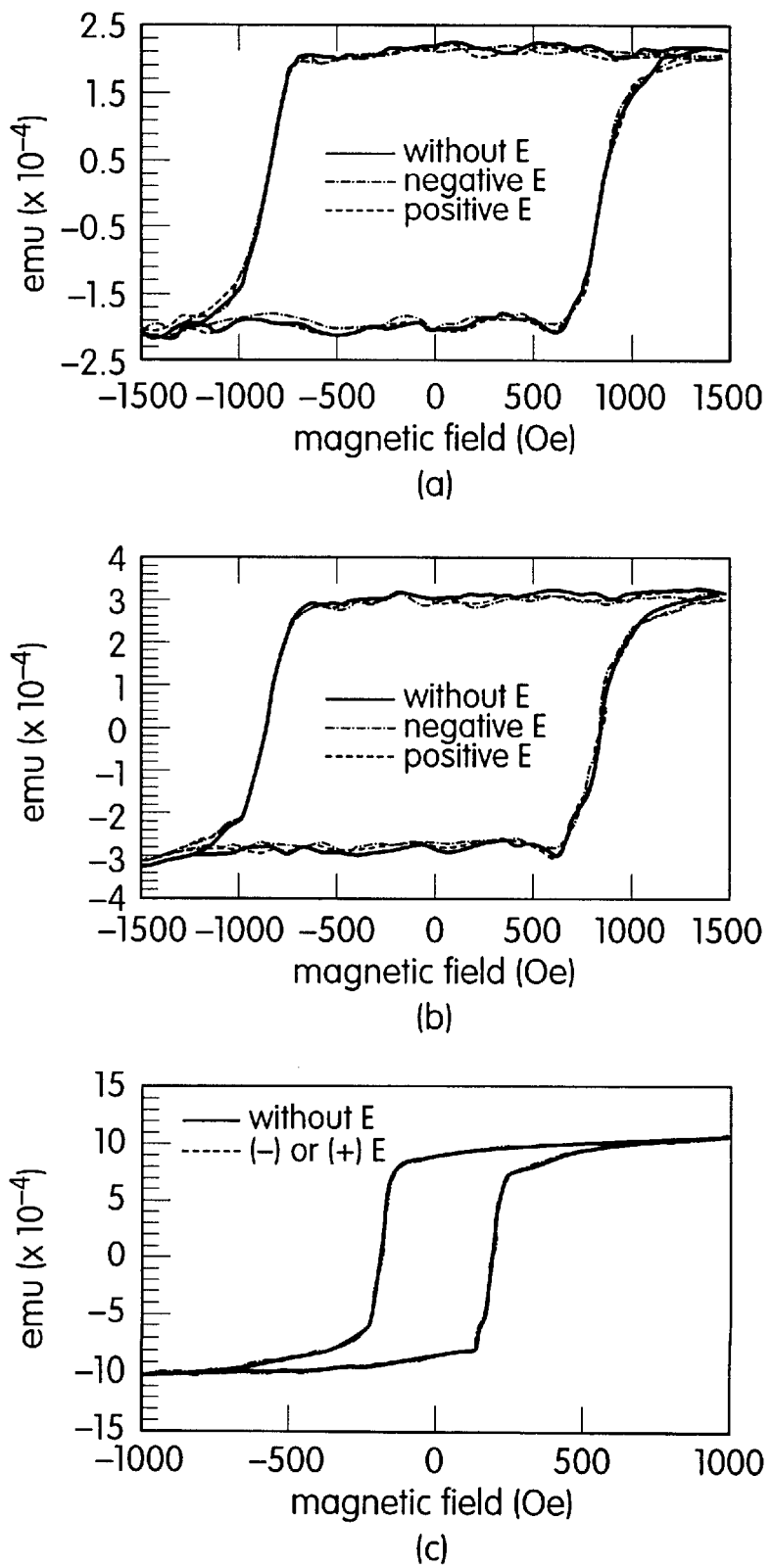
FIG. 19 shows an electric field effect on magnetization in several different samples.

FIG. 10 shows the MOKE hysteresis curve of a 200 nm MnAs/GaAs film which has a quite large Kerr rotation angle of about 0.4 degrees (by comparison rare earth alloys, like Tb—Fe compound, has a Kerr angle of 0.3~0.5 degrees). FIG. 11 shows the effect when an electric field of $10^6$ V/m is applied to this sample. As the Figure shows, there is no difference between MOKE signals with and without the electric field. Pure GaAs also shows no electric field effect (see FIG. 12). In contrast to these results, the unannealed 20 nm MnAs, as seen in FIG. 13, shows an electric field effect. The MOKE signal becomes smaller (about 3~4%) under a negative electric field at point A and larger under a negative field at point B. In contrast, a positive electric field causes no effect on the magnitude of the MOKE signals. The dependence of the MOKE signal on electric field strength is illustrated in FIG. 14. It is found that the signal difference y (with respect to no electric field) has a relationship, $y=ax^b$, a~0.18, b~0.35 with the field strength x and with a standard deviation of 0.07 $\mu V$. The annealed sample of 20 nm thickness shows a similar electric field effect on MOKE as seen in FIGS. 15 and 16. For thicker films (50, 100, 200 nm MnAs), the laser light will not reach the orthorhombic phase near the MnAs/GaAs interface and thus fails to detect the electric field effect. Ellipsometer (wavelength of 632.8 nm) measurements of the refractive index of samples in an electric field also show a similar effect. In FIG. 17(a), the 50 nm MnAs film shows no electric field effect on refractive index, whereas the refractive index of the 20 nm MnAs (FIG. 17(b)) increases linearly (approximately 1 percent) with increasing positive electric field. The independence of refractive index on negative electric field is contrasted with the independence of MOKE on positive electric field. The MOKE is inversely proportional to refractive index squared, causing a reduction of 2 percent at positive field. As shown in FIG. 19, the magnetization of the 20 nm MnAs sample decreases about 3.5 percent at positive electric field. The electric field effect on MOKE of the 20 nm MnAs in the negative electric field can be explained by the change of magnetization of the sample since the MOKE signal linearly depends on the magnetization.

Figure 18:
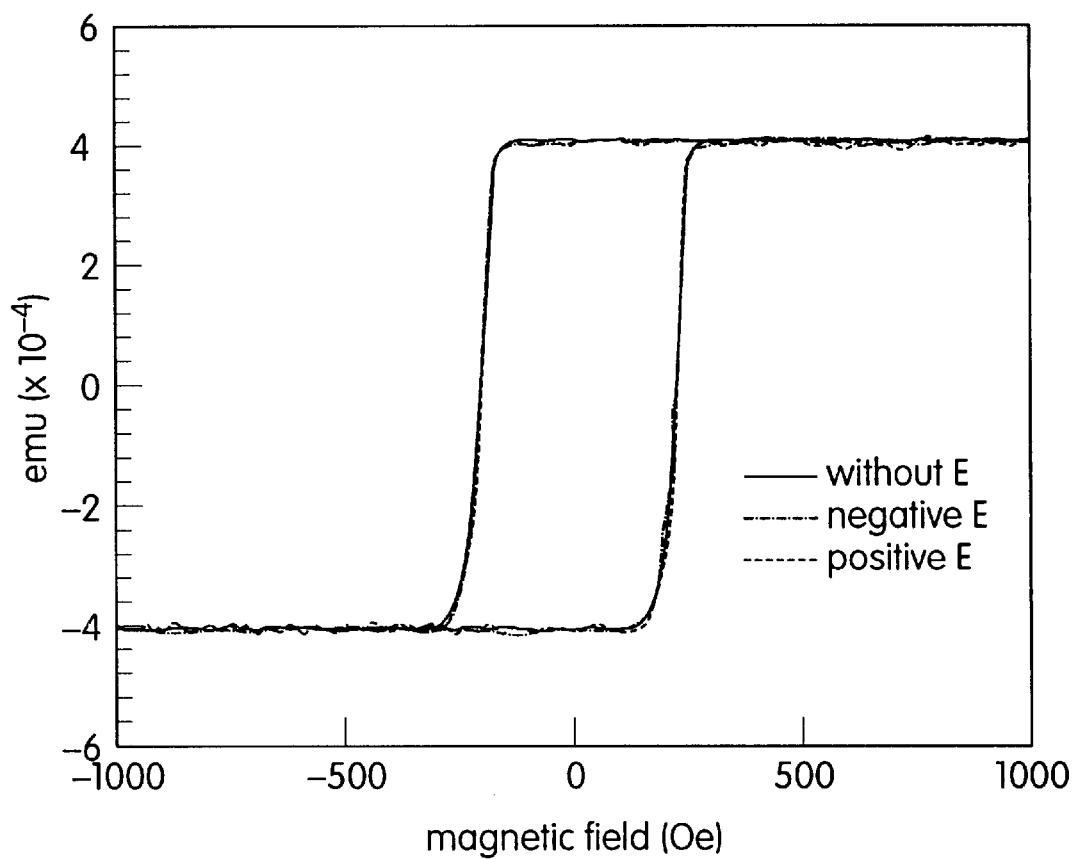
FIG. 18 shows a VSM magnetization hysteresis curve of a 100 nm MnAs film with easy axis in the [110] direction of GaAs substrate which corresponds to [−1−120] direction of MnAs substrate. No electric field effect is observed.

FIG. 18 shows the VSM magnetization hysteresis curve of a 100 nm MnAs/GaAs film with easy axis in the [110] direction of the GaAs which corresponds to [−1−120] direction of MnAs. The square hysteresis curve shows that the film has favorable ferromagnetic properties with relatively small coercivity (~180 Oe) and high magnetization (~440 emu/cm³). The other samples with different thicknesses also have similar hysteresis curves. FIG. 18 also shows that there is no electric field effect on magnetization of this sample in positive or negative electric fields of $10^6$ V/m. In other words, there is no difference between magnetization curves with and without the electric field. Mean values of magnetization for zero, negative and positive electric fields are $4.06 \times 10^{-4}$, $4.05 \times 10^{-4}$ and $4.05 \times 10^{-4}$ emu respectively. Standard deviations for zero, negative and positive electric fields are $4.5 \times 10^{-6}$, $6.2 \times 10^{-6}$ and $4.9 \times 10^{-6}$ emu respectively.

In contrast to these results, the 20 nm (both annealed and unannealed samples) and 50 nm MnAs, as seen in FIG. 19, show an electric field effect. The Figure shows that positive or negative electric field reduces magnetization by 3.5 percent and 1 percent, respectively, when electric fields of $10^6$ V/m are applied to the sample. Mean values of magnetization reduction for (a), (b) and (c) are $0.95 \times 10^{-5}$, $1.5 \times 10^{-5}$ and $1.4 \times 10^{-5}$ emu respectively. Standard deviations for (a), (b) and (c) are $0.55 \times 10^{-5}$, $0.93 \times 10^{-5}$ and $0.4 \times 10^{-5}$ emu, respectively. 100 nm MnAs film show the reduction of magnetization of 0.3 percent (see FIG. 18), although the standard deviation is four times bigger. It seems that the magnetization of the samples is decreased when electric fields are applied to the sample, however the decrease of magnetization is not enough to be detected because of the relatively large magnetization value of thicker MnAs films.

Figure 20:
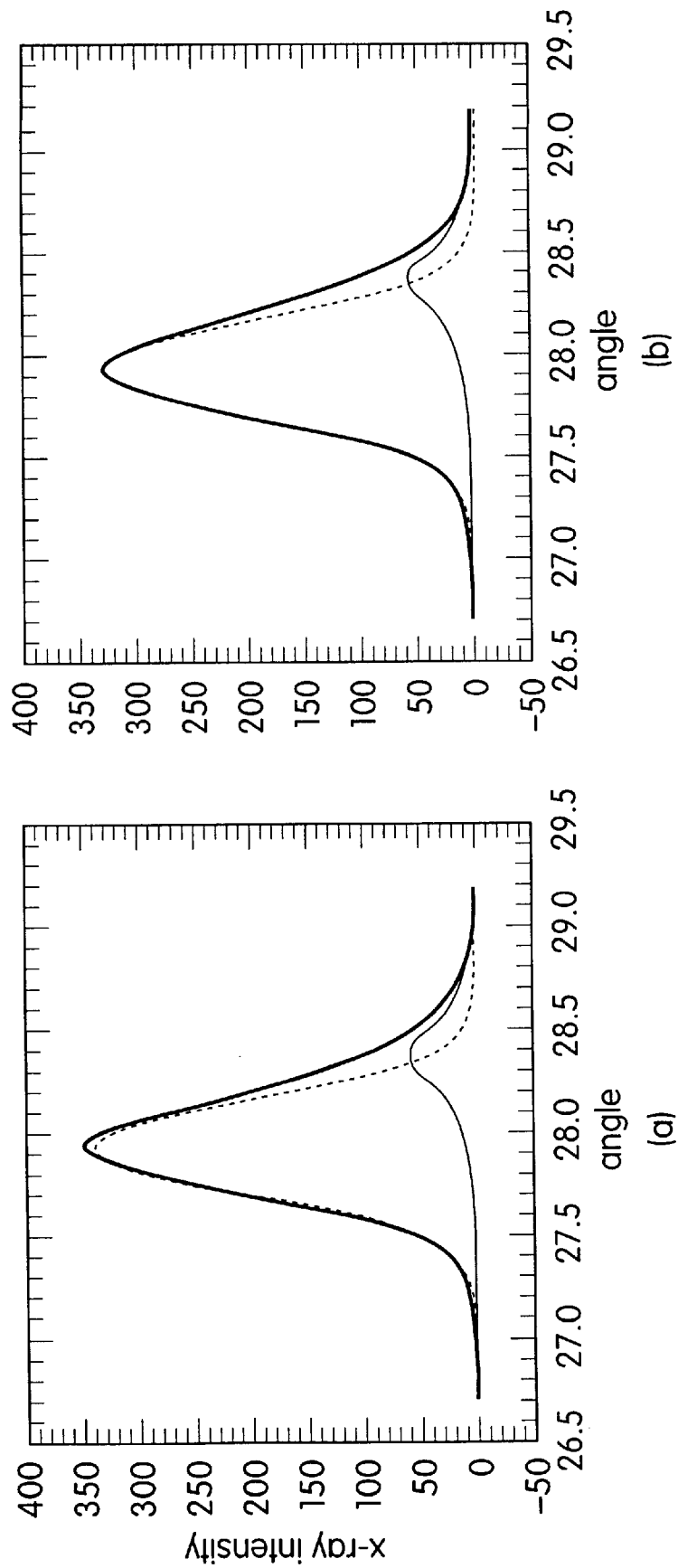
FIG. 20 shows diffraction peaks of the 20 nm MnAs/GaAs (unannealed).
Figure 21:
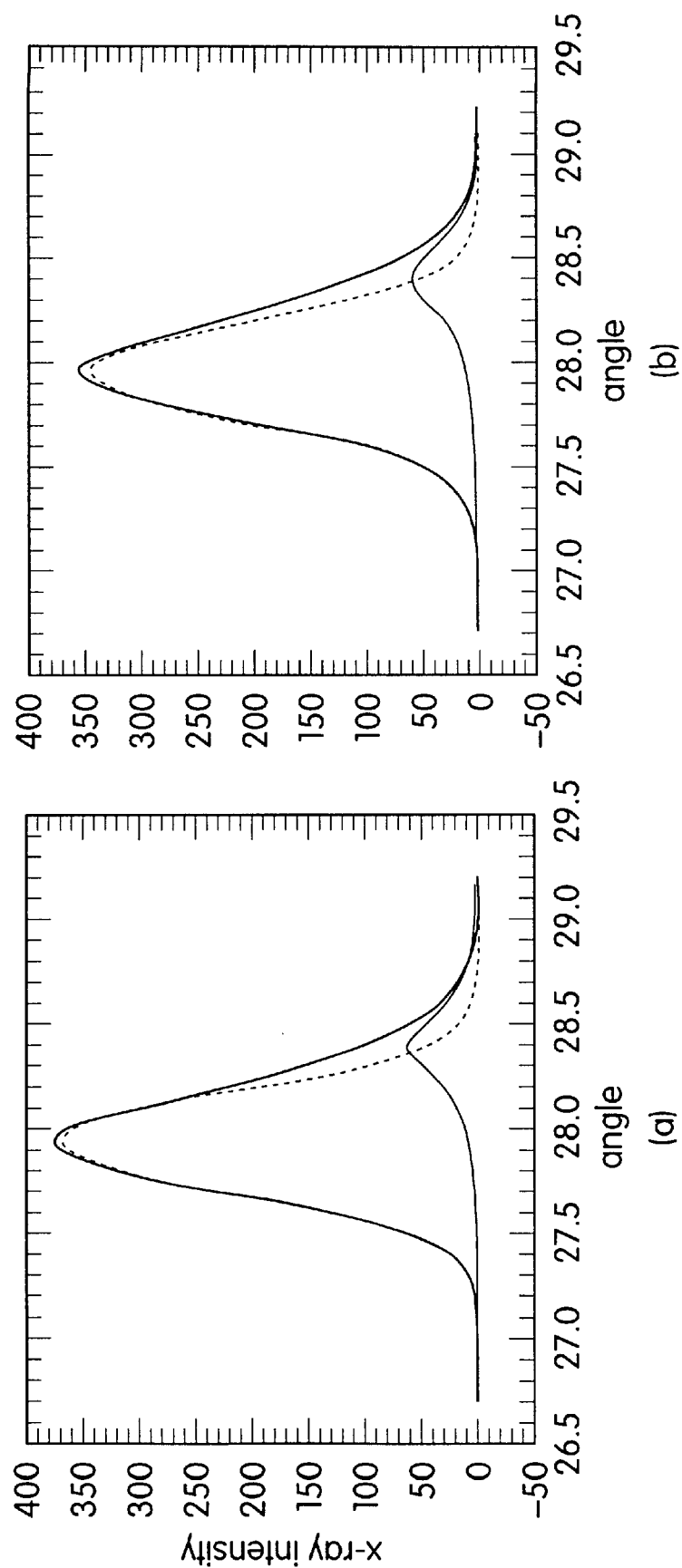
FIG. 21 shows diffraction peaks of the 20 nm MnAs/GaAs (unannealed).
Figure 22:
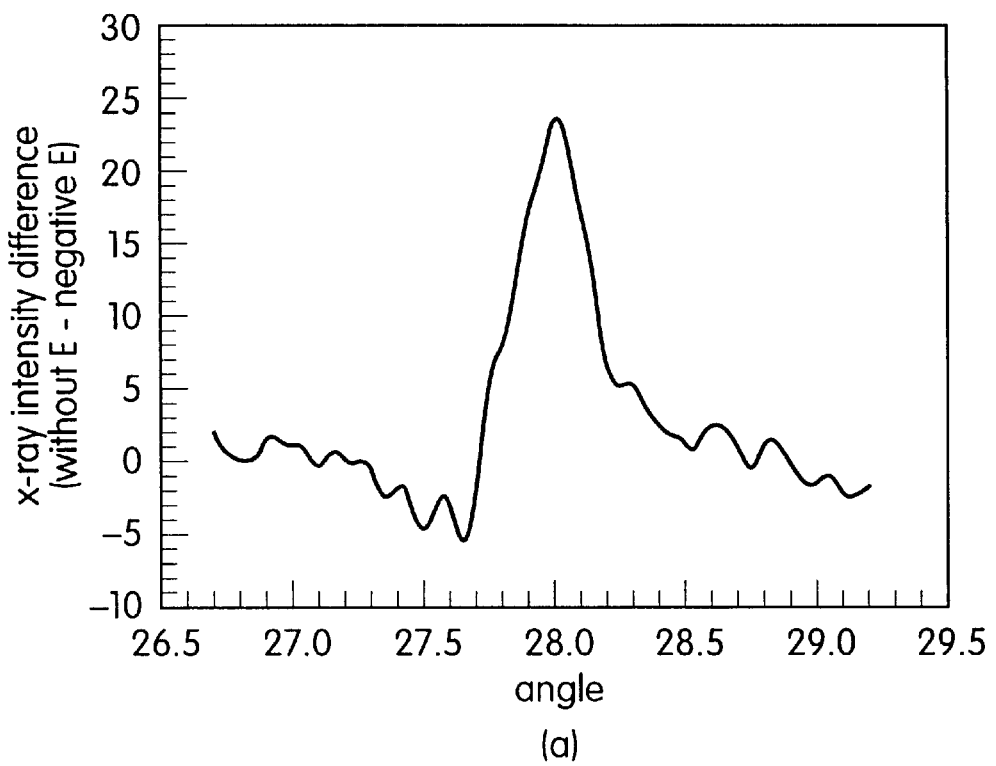
FIG. 22 shows X-ray intensity differences without E and with E.
Figure 22:
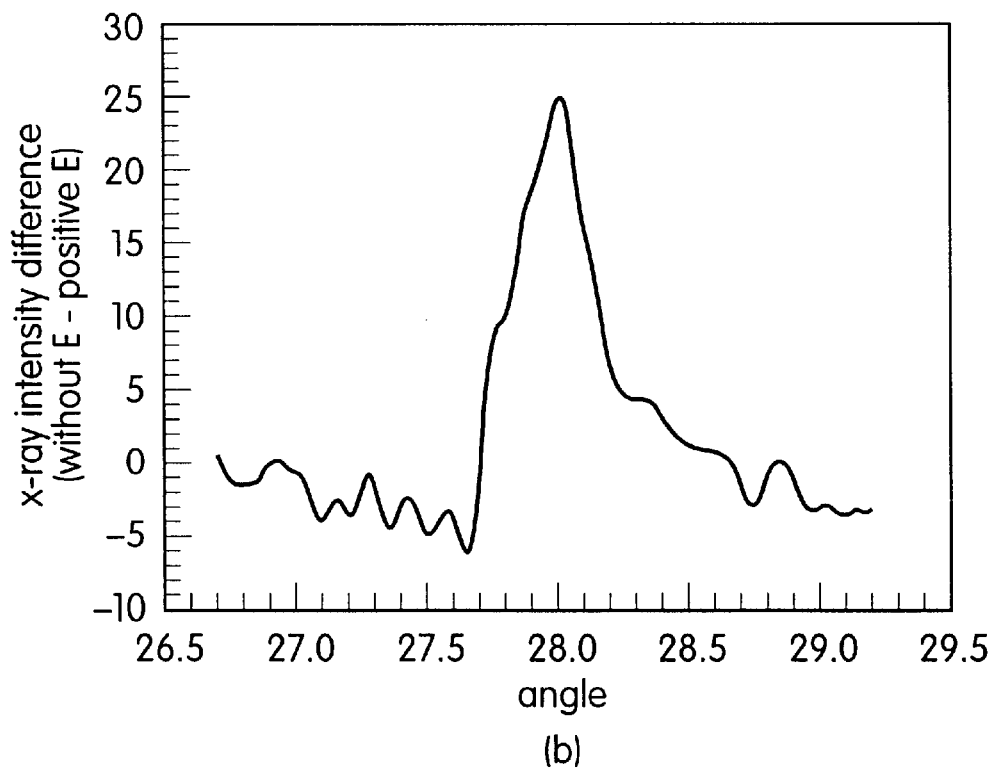
Figure 23:
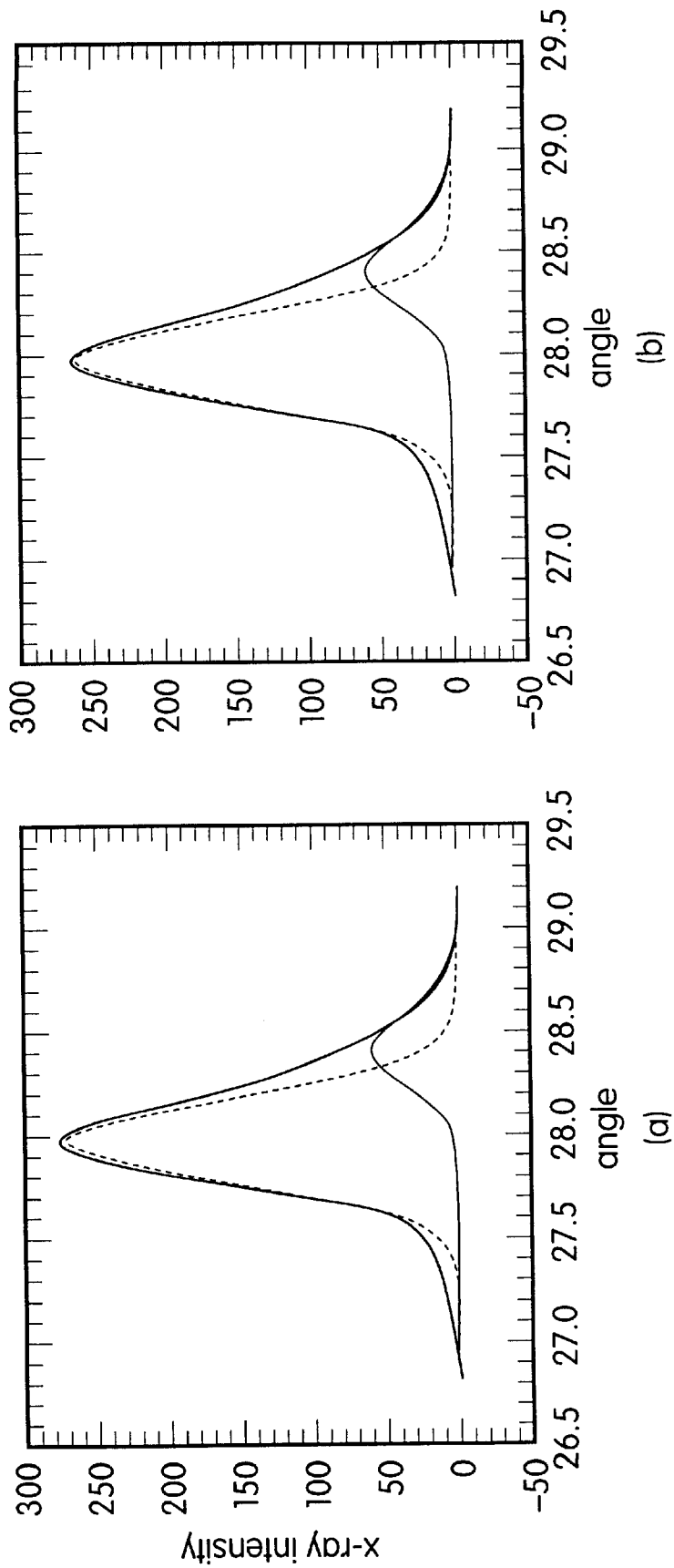
FIG. 23 shows diffraction peaks of annealed 20 nm MnAs/GaAs.
Figure 24:
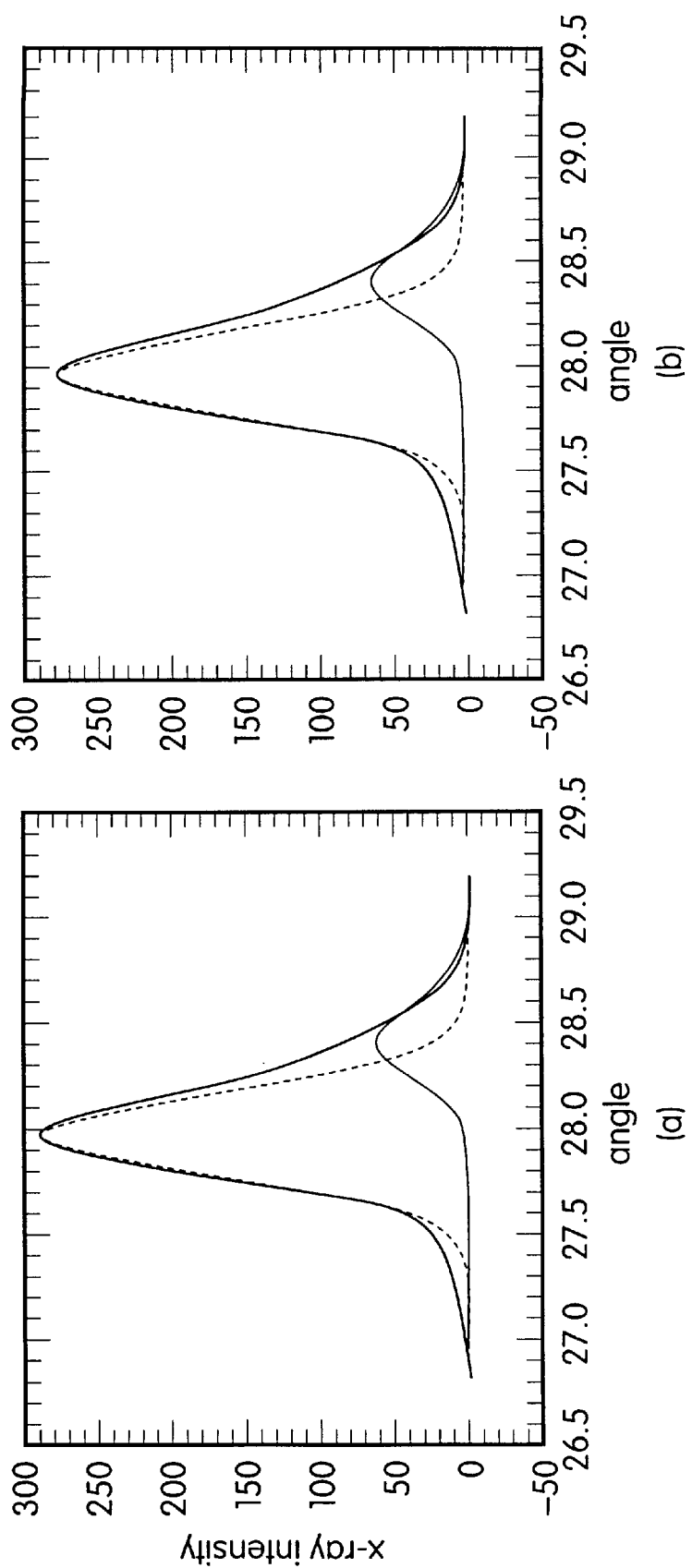
FIG. 24 shows diffraction peaks of annealed 20 nm MnAs/GaAs.
Figure 25:
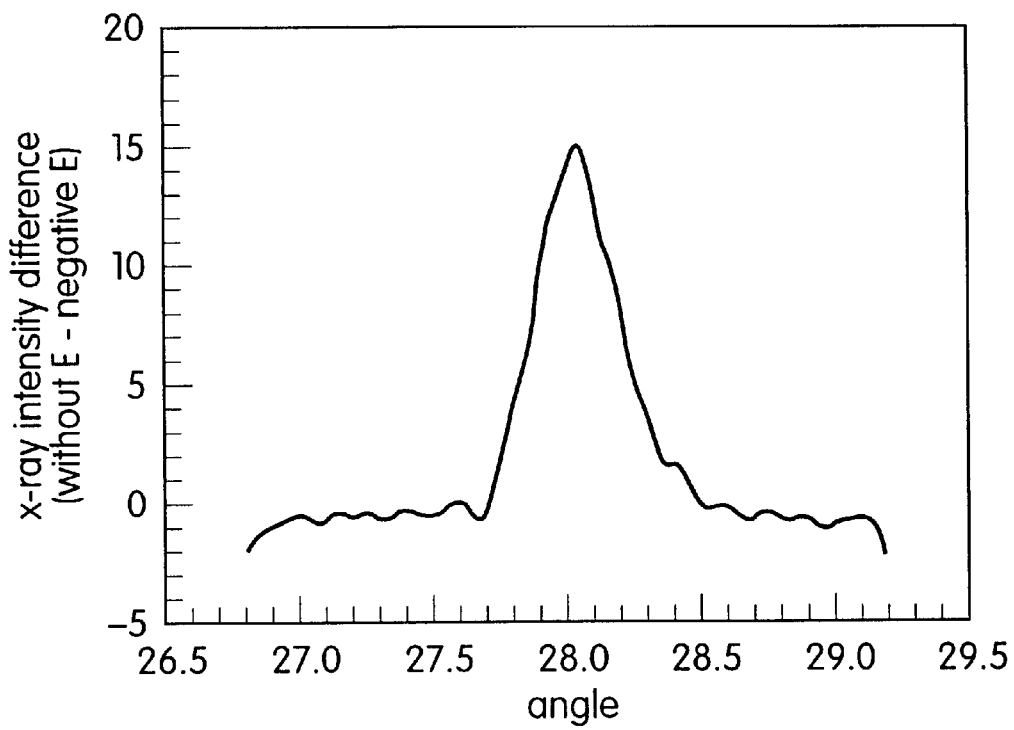
FIG. 25 shows X-ray intensity differences without E and with E.
Figure 25:
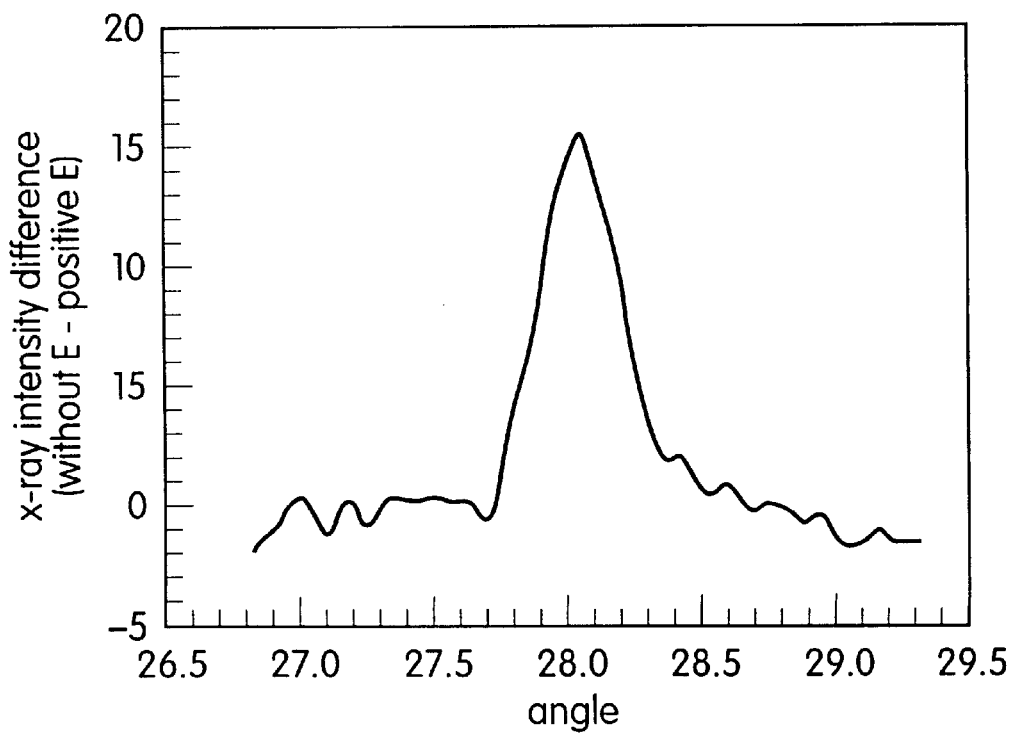

The cause of the electric field effects on magnetization may be due to the structural variation of the samples. To determine any effect of the electric field on the structure of the samples x-ray diffraction experiments were undertaken. A primary diffraction peak for the 20 nm MnAs/GaAs under no electric field, a negative field and a positive field are illustrated in FIGS. 20 and 21. In each diffraction scan, best fit functions have been found which correspond to two phases: ferromagnetic hexagonal and nonferromagnetic orthorhombic structures. The left peak corresponds to hexagonal structure and the right one corresponds to orthorhombic structure. In these samples, the orthorhombic phase is believed to be located near the GaAs substrate because MOKE does not decrease as the sample thickness decreases and the refractive indices of the samples are constant around 2.47, meaning the ferromagnetic hexagonal phase is located uniformly in the surface of the sample. The peaks were fitted using a curve fitting program 'Peakfit (Jandel)' (*Jandel Scientific Peakfit ver.* 2.1, AISN Software (1992)). Dotted lines are Gaussian-type fitted curves (Langford, J. I. *Appl. Cryst.* 11, 10 (1978)). The goodness of curve fitting is represented by $$G = \sqrt{\frac{\sum (Y_{raw} - Y_{fitted})^2}{Y_{raw}^2}},$$

where $Y_{raw}$: raw data, $Y_{fitted}$: fitted data of peak. $-1 \leq G \leq 1$, $G = \pm 1$ for a perfect fit. The goodness of the peak fitting ranged from 0.966 to 0.999. It can be seen in FIGS. 20–22 that as the positive or negative electric field is applied to the sample, the area of the peak representative of the hexagonal phase is reduced by approximately 5% but not the orthorhombic phase. The same change is found in the annealed 20 nm MnAs sample, as is shown in FIGS. 23–25. Thus, the imposition of an electric field clearly changes the structure, or rotates the hexagonal structure from its original orientation since that would reduce the peak area also.

A magnetoelectric effect could be found at some spin ordered materials. These MnAs thin films are not considered to be a magnetoelectric material because a magnetoelectric effect could be usually observed in antiferromagnetic or weak ferromagnetic oxide materials and the dependence of magnetoelectric effect on electric field strength is linear or quadratic which is different from the electric effect that was observed.

Accordingly, it has been demonstrated that MnAs can be grown on GaAs substrate by molecular beam epitaxy. Through MOKE and refractive index measurements from 20 nm MnAs it was found that the Kerr signal decreased by 4 percent in a negative electric field and the refractive index increased by 1 percent in a positive field. It seems that the change of MOKE signal with a negative electric field is related to the interface of the samples where laser light can reach. In the VSM study, it was observed that the magnetization of the 20 nm and 50 nm samples is decreased under both positive and negative electric fields by 3.5 percent and 1 percent, respectively. The electric field effect on MOKE of the 20 nm MnAs in a negative electric field can be explained by the change of magnetization of the samples. The cause of the electric field effect on magnetization seems to be due to a structural variation. X-ray diffraction results show that ferromagnetic hexagonal structure decreased by 5 percent in electric fields, which could result in the reduction of magnetization of the samples.

As will be obvious to one of skill in the art upon this disclosure, the films of the present invention can be used in a multitude of applications. Some examples include, but are not limited to, magnetic information storage, optoelectronic devices and electronic devices. In one embodiment, the present invention may be used to improve applications which currently depend on varying the magnetization by means of an applied magnetic field. Use of an electric field to vary the magnetization requires less energy and can be altered more rapidly than a magnetic field. In this embodiment, an electric field can be generated by an electronic device integrated with a ferromagnetic film of the present invention.

Alternatively, since the index of refraction increases in positive electric fields only, the films could be used in optoelectric devices. Changes in index of refraction are currently used in optoelectric devices, for example, to switch optical signals between several paths. The film of the present invention is particularly suitable for this use since it lends itself better to integration with electronic functions. Accordingly, the generation of multilayer devices is possible. For example, the MnAs/GaAs composite could be integrated with GaAs based lasers to provide a mechanism for tuning the operating wavelength or modulating the light output. An optical waveguide or fiber can have its transmission modified by altering the reflectivity by means of changes in the index of refraction at its surface, thereby providing a means to modulate the wave being transmitted.

In addition, the magneto optical Kerr effect is decreased in negative electric fields only. Further, the percentage of change is larger in thinner films. The decrease is about 4 percent in 20 nm films at $10^6$ V/m. The magnetization of the ferromagnetic layer can be determined from the Kerr signal. Modulating the signal by means of a varying electric field combined with selective detection of the modulated signal makes possible much improved detection sensitivity thus, offering more reliable detection of information stored magnetically. High information density will also be achieved since smaller amounts of magnetic material are required.

The following nonlimiting examples are provided to further illustrate the present invention.

EXAMPLES

Example 1

Film Growth

Molecular Beam Epitaxy (MBE) is a process of depositing epitaxial films from molecular or atomic beams on a heated substrate under ultra high vacuum (UHV) conditions. The beams are thermally produced in Knudsen-type effusion cells which contain the elements of the desired epitaxial film. The temperatures of the cells are accurately controlled to generate the thermal beam flux with appropriate intensity. In this invention, thin film growth was carried out by means of a Riber 2300 MBE machine, which was equipped with elemental Mn and Ga effusion cells. For As a high temperature cracker with internal buffer is incorporated at the exit end of the As effusion cell. This cracker dissociates the tetramers to dimers (Swaninathan, V. and Macrander, A. T. Materials Aspects of GaAs and InP Based Structures, (Prentice Hall 1991), p.140). A 100 nm-thick undoped GaAs buffer layer was initially grown on a GaAs (001) substrate with a substrate temperature, Ts, of 600° C. After growth of the buffer layer the substrate was subsequently cooled to a temperature of 200° C. while both shutters of the Ga and As effusion cells were closed. Reflection high energy electron diffraction (RHEED) was employed to monitor the surface symmetry. During the cooling process, RHEED patterns of the buffer layer changed from (2×4) to c(4×4). This surface reconstruction changed to disordered c(4×4) [d(4×4)] when the As2 effusion cell was opened again to the growth chamber. The Mn effusion cell was then opened, and type A of MnAs films with thicknesses of ~2 to 200 nm were grown at a rate of 0.8 nm/minute at a substrate temperature of between 200 and 250° C. The As/Mn ratio was set between 2.0 and 5.0. When one monolayer of Mn was predeposited on the clear c(4×4) GaAs surface at 200~220° C., the RHEED pattern changes to (1×1). On this surface both Mn and $As_2$ effusion cells were opened to grow type B MnAs films.

Figure 2:
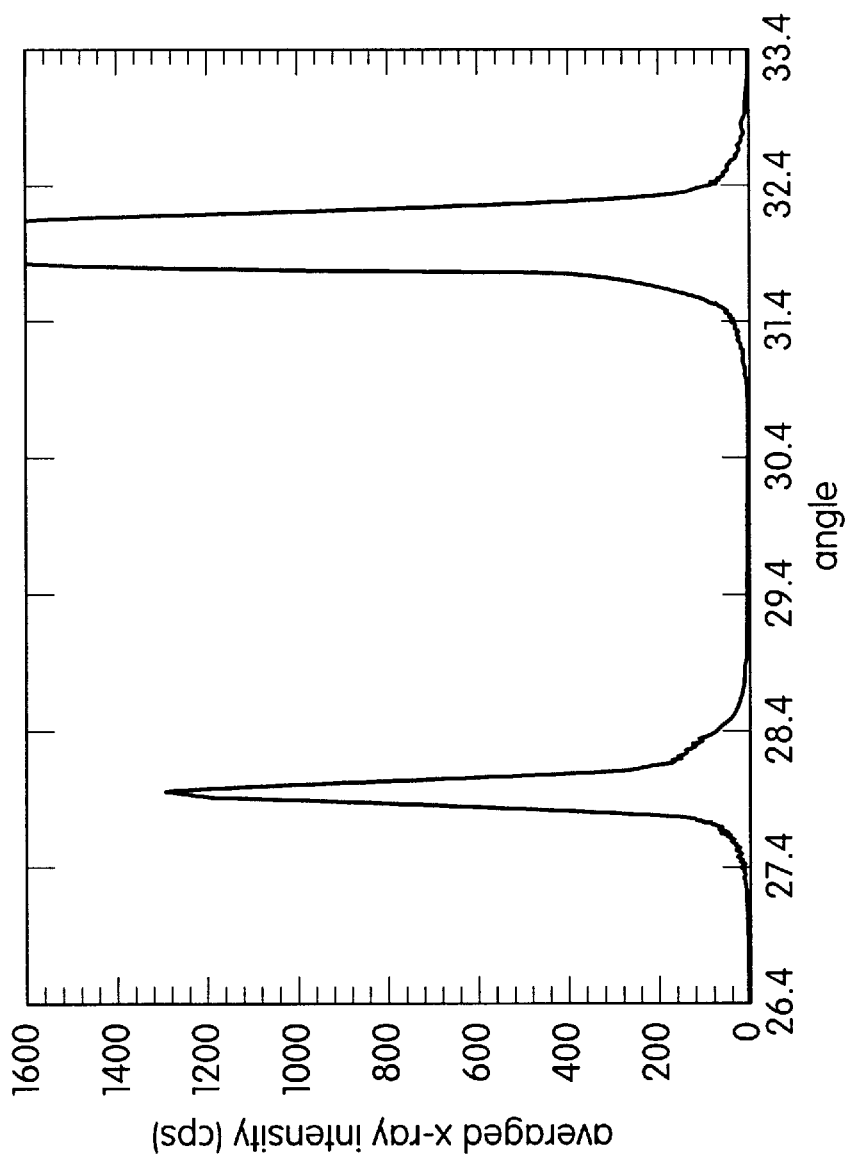
FIG. 2 shows room temperature x-ray diffraction results with 100 nm MnAs/GaAs.
Figure 3:
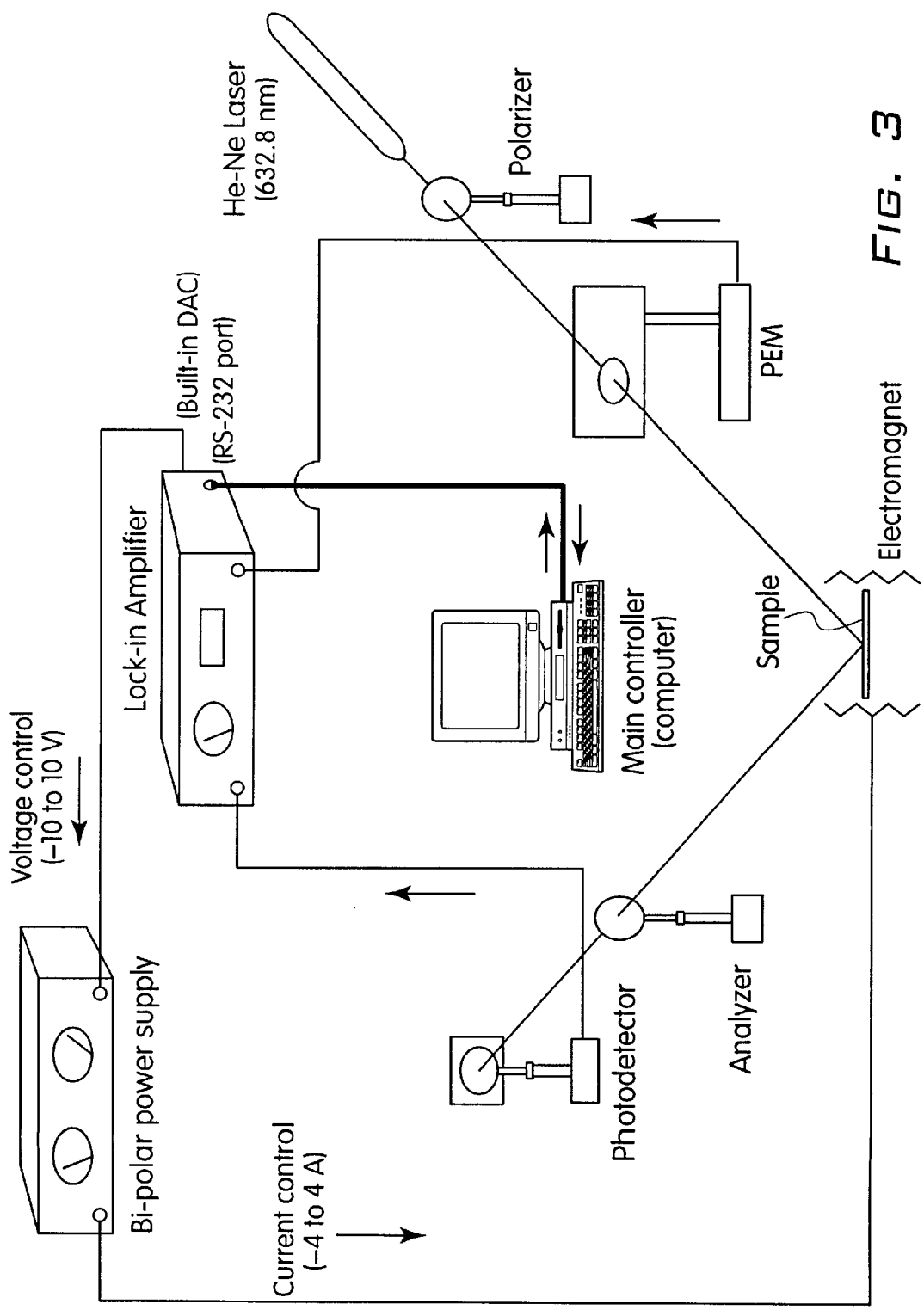
FIG. 3 shows a schematic of the MOKE measurement system.

Structural analysis of the films was performed on a Rigaku x-ray diffractometer. The diffractometer was operated with the sample at room temperature at an x-ray tube voltage of 40 kV and current of 20 mA. A copper target was used to generate the x-ray radiation. FIG. 2 shows an example of an x-ray diffraction scan of a 100 nm thickness MnAs sample. The peak at scattering angle 27.8° corresponds to reflection from the (−1100) plane of hexagonal MnAs, and Bragg's law gives an interplanar spacing d of 0.321 nm. The smaller peak near 28.3° is due to reflection from the (002) plane of orthorhombic MnAs, and has a d-spacing of 0.317 nm. The relatively strong peak at 31.7° arises from the (002) reflection of the GaAs.

Example 2

MOKE Measurement Apparatus and Setup

Figure 5:
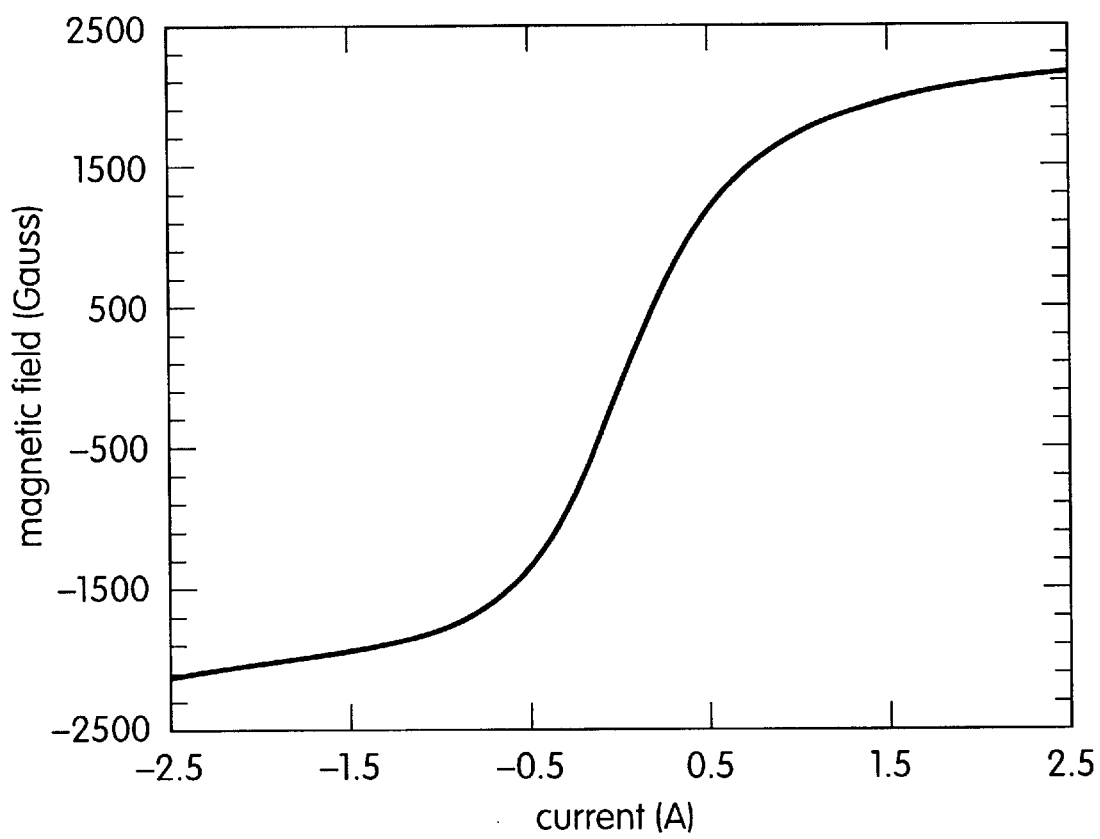
FIG. 5 shows a magnetic field generated by the electromagnet. Pole gap distance is 6 cm.

Light from a 15 mW He—Ne laser (wavelength of 632.8 nm) is polarized at an angle of 45° relative to the s-axis by a polarizer. S-axis and P-axis represent the direction perpendicular to the plane of incidence and the direction parallel to the plane of incidence, respectively. The polarized light is then modulated by a photo elastic modulator (PEM-80, Hinds) at a modulation frequency of 50 kHz. The light passing through the modulator M exhibits a periodically varying retardation $\phi=(\phi_o \sin \omega_M t)$, where $\omega_M$, $\phi_o$ are modulation frequency and amplitude of retardation, respectively. By retardation, it is meant the relative phase difference of the two circularly polarized components of the light. This modulated light is then reflected off the sample, which is subjected to a magnetic field applied parallel to the plane of incidence for longitudinal MOKE. An electromagnet that generates a maximum field of 2500 Oe at a pole gap of 5 cm has been used. The permalloy pole pieces were tapered to a diameter of 5 cm to maximize the magnetic field. FIG. 5 shows the generated magnetic field hysteresis curve which was calibrated. The reflected light is then sent through an analyzer, which is simply another polarizer. The analyzer is rotatable by an arbitrary angle $\alpha$ with respect to the s-axis. Finally a photodiode detector (Hamamatsu, P839s) is employed to detect the light signal. However, the MOKE signal from the photo detector is usually too weak or noisy to detect directly. Thus, a lock-in amplifier (SR-510) has been utilized to detect the MOKE signal of the samples in this experiment. Fourier components $I_1$ and $I_2$ of the light intensity at $\omega M$ and $2\omega_M$ are detected by the lock-in amplifier. This lock-in amplifier also has a built-in programmable digital to analog converter (DAC), which can be used to control the electromagnet remotely. A 386-DX personal computer (Gateway2000) was interfaced with the programmable lock-in amplifier for data acquisition.

Example 3

Mathematical Representations of Setup

Figure 4:
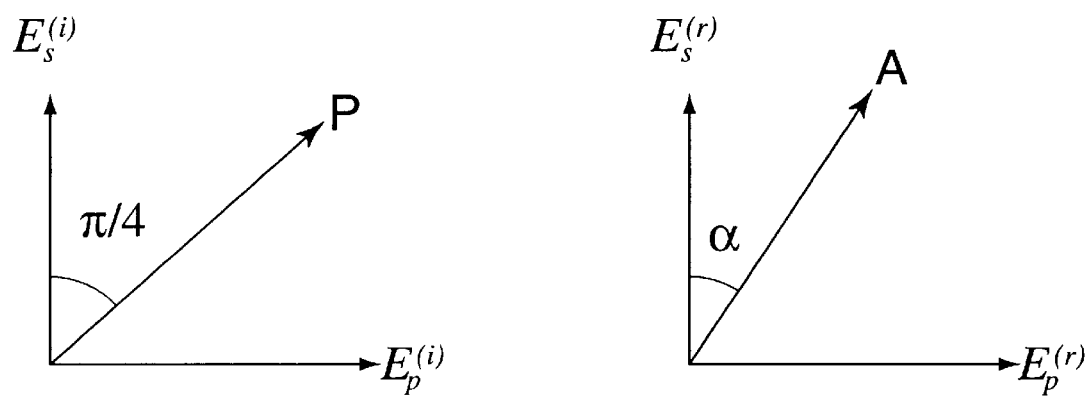
FIG. 4 shows orientations of the light vector components, the polarizer (P) and analyzer axes (A) depicted in planes normal to the propagation direction. In this Figure, 'S-' and 'p-' axes represent the directions perpendicular to the plane of incidence and parallel to the plane of incidence, respectively. Superscripts i and r signify, respectively, incident and reflected light.

FIG. 4 shows the orientations of the vector components of the light ($E_p^{(i)}$, $E_s^{(i)}$, $E_p^{(r)}$, $E_s^{(r)}$), the polarizer (P) and the analyzer (A) with respect to the p and s directions. The p-polarization is that electric field component parallel to the plane of incidence, while the s is that component perpendicular to the plane of incidence. Abbreviations (i) and (r) represent the incident and reflected light, respectively. The electric field E(r) transmitted through the analyzer can be described by the Jones matrices (Hecht, E. Optics, (Addison-Wesley 1987), p.323):

$$E(r) = A \cdot S \cdot M \cdot P \cdot E$$

where $$A = \begin{bmatrix} \cos^2\alpha & \sin\alpha\cos\alpha \\ \sin\alpha\cos\alpha & \sin^2\alpha \end{bmatrix} : \text{Analyzer}$$

$$S = \begin{bmatrix} r_p & r_{ps} \\ r_{ps} & r_s \end{bmatrix} : \text{Sample surface}$$

$$M = \begin{bmatrix} \exp\left(\frac{i\varphi}{2}\right) & 0 \\ 0 & \exp\left(\frac{-i\varphi}{2}\right) \end{bmatrix} : \text{Modulator}$$

$$P = \frac{1}{2}\begin{bmatrix} 1 & 1 \\ 1 & 1 \end{bmatrix} : \text{Polarizer}$$

$$E = \begin{bmatrix} 1 \\ 1 \end{bmatrix} : \text{Light incident on polarizer}$$

The reflectivity S of the sample, is described by the complex Fresnel coefficients, $r_p$ and $r_s$, and off-diagonal terms, $r_{ps}$ and $r_{sp}$; the latter arise from the magneto optical effects.

$$r_p = r_p \exp(i\delta_p)$$

$$r_s = r_s \exp(i\delta_s)$$

$$r_{ps} = r_{ps} \exp(i\delta_{ps})$$

$$r_{sp} = r_{sp} \exp(i\delta_{sp})$$

$$r_{ps} = -r_{sp}$$

Analysis shows that the Kerr rotation angle $\theta k$ may be different for p and s polarized light and can be expressed by (Yoshino, T. and Tanaka, S. Japan. *J. Appl. Phys.* 5, 989 (1966)):

$$\theta_p = Re(r_{ps}/r_p)$$

$$\theta_s = Re(r_{sp}/r_s)$$

With light of intensity $I^{(i)}$ incident on the sample and polarized 45° with plane of incidence $$E_p^{(i)} = E_s^{(i)} = (I^{(i)}/2)^{1/2}$$

Making use of the Fresnel coefficients, the intensity of reflected light after the analyzer is:

$$I^{(r)}(E^{(r)})^2 = III(i)/2$$

with the amplitude $$\hat{I} = A + B\cos\phi + C\sin\phi$$

Here $$A = r_p^2 \cos^2\alpha + r_s^2 \sin^2\alpha + r_{sp}^2 + r_{sp}\sin 2\alpha[r_p\cos(\delta_p - \delta_{sp}) - r_s\cos(\delta_s - \delta_{sp})]$$

$$B = \sin 2\alpha[r_p r_s \cos(\delta_s - \delta_p) - r_{sp}^2] + 2r_{sp}[r_s\sin^2\alpha\cos(\delta_s - \delta_{sp}) - r_p\cos^2\alpha\cos(\delta_p - \delta_{sp})]$$

$$C = r_p r_s \sin 2\alpha \sin(\delta_s - \delta_p) + 2r_{sp}[r_s\sin^2\alpha\sin(\delta_s - \delta_{sp}) - r_p\cos^2\alpha\sin(\delta_p - \delta_{sp})]$$

and $$\cos\phi = \cos(\phi_0 \sin\omega_M t)$$
$$= J_0(\phi_0) + 2J_2(\phi_0)\sin 2\omega_M t + \ldots$$

Here $J_k(k=0,1,2\ldots)$ are the first kind Bessel functions of order k:

By use of these relations, the amplitude equation can be rewritten as:

$$\hat{I} = \hat{I}_0 + \hat{I}_1 \sin\omega_M t + \hat{I}_2 \cos 2\omega_M t + \hat{I}_3 \sin 3\omega_M t + \ldots$$

with the expansion coefficients:

$$\hat{I}_0 = A + B\,J_0(\phi_0)$$
$$\hat{I}_1 = 2C\,J_1(\phi_0)$$
$$\hat{I}_2 = 2B\,J_2(\phi_0)$$

Thus, the output voltage of the photodetector consists of three components: a dc component, an ωM component and a 2ωM component.

By using analyzer angle α equal to 0 or π/2, the above equations become:

(i) α=0 (p polarization):

$$\hat{I}_0 = r_p^2 + r_{sp}^2 - 2J_0(\phi_0) r_{sp} r_p \cos(\delta_p - \delta_{sp})$$
$$\hat{I}_1 = 4J_1(\phi_0) r_{sp} r_p \sin(\delta_p - \delta_{sp})$$
$$\hat{I}_2 = 4J_2(\phi_0) r_{sp} r_p \cos(\delta_p - \delta_{sp})$$

(ii) α=π/2 (s polarization):

$$\hat{I}_0 = r_s^2 + r_{sp}^2 - 2J_0(\phi_0) r_{sp} r_s \cos(\delta_s - \delta_{sp})$$
$$\hat{I}_1 = 4J_1(\phi_0) r_{sp} r_s \sin(\delta_s - \delta_{sp})$$
$$\hat{I}_2 = 4J_2(\phi_0) r_{sp} r_s \cos(\delta_s - \delta_{sp})$$

Using the relationship $r_{sp}^2 \ll r_s^2, r_p^2$ and $J_0(\phi_0) \sim 0$ and taking into account the definition of Kerr angle, $$(\hat{I}_2/\hat{I}_0)_{\alpha=0} = -4J_2(\varphi_o)(r_{sp}/r_p)\cos(\delta_{sp} - \delta_p)$$
$$= -4J_2(\varphi_o)\theta_p$$

-continued $$(\hat{I}_2/\hat{I}_0)_{\alpha=\pi/2} = 4J_2(\varphi_o)(r_{sp}/r_s)\cos(\delta_{ps} - \delta_p)$$
$$= 4J_2(\varphi_o)\theta_s$$

Here $J_2(\phi_0) = 0.49$.

Hence, the lock-in signals at dc and 2ωM directly yield the Kerr rotations. Other methods of measuring the Kerr rotations are well known in the art (Sato, K. Japan. *J. Appl. Phys.* 20, 2403 (1981); Kim et al. *Appl. Opt.* 32, 1275 (1993); Yoshino, T. and Tanaka, S. *Japan. J. Appl. Phys.* 5, 989 (1966)).

Example 4

Measuring Electric Field Effect on MOKE

To measure an electric field effect on MOKE, a sample was placed between a copper plate and a copper mesh so that the laser beam could pass through the mesh, reflect off the sample surface, and exit through the mesh. A dc electric field of intensity up to $10^6$ V/m was applied normal to the sample surface. Negative electric field means that negative polarity is applied to upper surface of sample.

Example 5

Vibrating Sample Magnetometer with Applied Electric Field

A vibrating sample magnetometer (VSM) is used to measure the difference in magnetic induction between a region of space with and without a specimen therein (Jiles, D. Introduction to Magnetism & Magnetic Materials, (Chapman & Hall 1991), p.52). Therefore, it gives a direct measure of the magnetization of the sample. In this method, the sample is vibrated. A magnetic moment as small as $5 \times 10^{-6}$ emu is measurable with the VSM apparatus. In this study, the VSM was used to monitor the effect of an electric field on the magnetization of the MnAs samples.

Figure 6:
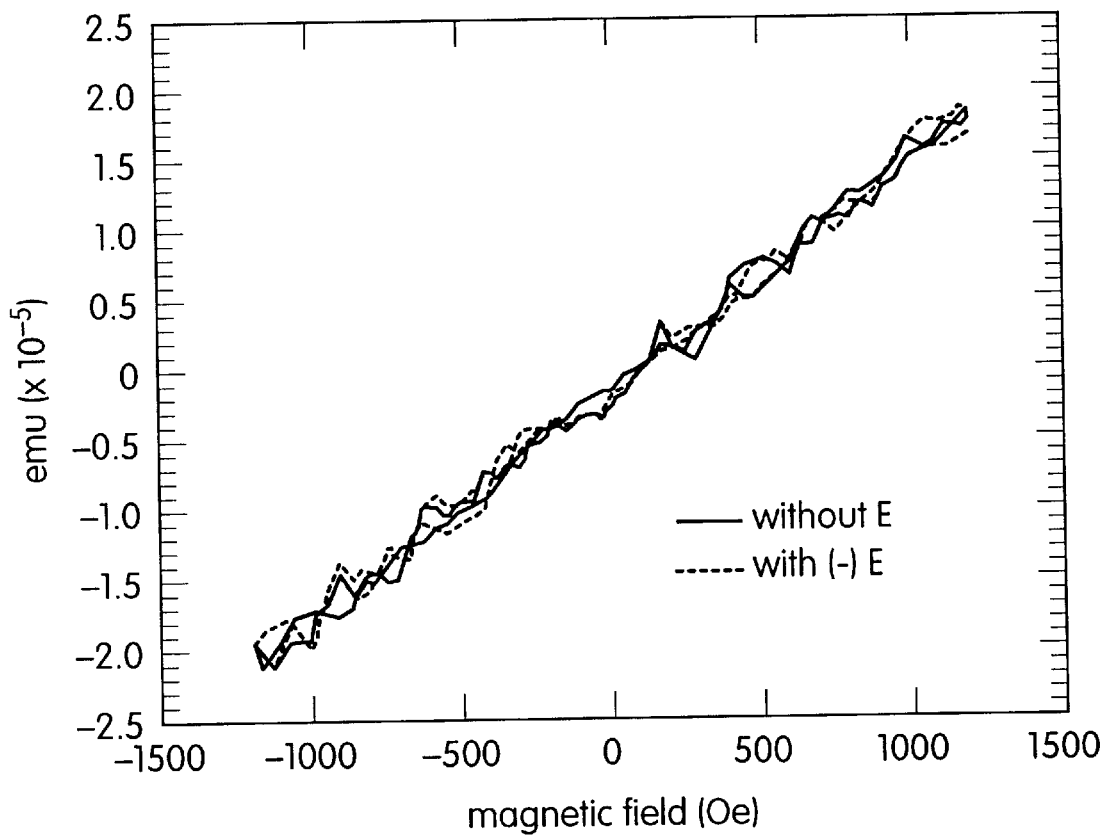
FIG. 6 shows the magnetization measurement in the electric field ($Mn_{0.7}Ni_{0.3}As/GaAs$)

Samples with 20 nm MnAs thickness (annealed and unannealed ones) and thicker samples (50 nm, 100 nm MnAs) have been studied. The sample was covered by teflon tape to prevent direct contact with the electrodes, which were fabricated using silver paint on both sides of the sample. Copper leads were attached to both electrodes by silver paint and terminated at a high voltage power supply. The sample was then attached to the VSM quartz sample holder with rubber cement. The magnetic susceptibilities of teflon and quartz (both are diamagnetic) are very low (less than $10^{-7}$) and hardly affect the magnetization measurement of the samples. FIG. 6 shows the electric field effect on magnetization of paramagnetic $Mn_{0.7}Ni_{0.3}As$ by VSM. There is no change between with and without electric fields. Pure GaAs, a non magnetic material, also shows no electric field effect. Therefore, an electric field does not affect the measurement of magnetization of VSM.

Example 5

X-ray Analysis with Electric Field

X-ray diffraction is a general tool for study of the structure of matter and can be employed to examine a possible change of d-spacing or phase of the material under external influences and was used to measure the electric field effect on MnAs/GaAs. To apply an electric field to the sample, a special sample holder was devised. The sample was placed between two copper electrodes which were fixed so that the x-ray beam could pass below the upper copper plate, reflect off the sample surface, and exit through the opposite end. Copper leads were attached to both electrodes by soldering and terminated at a high voltage power supply. A dc electric field of intensity up to $10^6$ V/m was applied normal to the sample surface.

What is claimed is:

1. An apparatus having ferromagnetic properties comprising:
   a first layer having the formula III-V;
   a second layer disposed on the first layer, the second layer including a metal and the V element present in the first layer, said second layer being thick enough to be ferromagnetic; and
   an electric field device for applying an electric field such that at least one of magnetization, magneto-optical properties and index of refraction of the second layer are varied by the electric field.

2. The apparatus as recited in claim 1, wherein the first layer includes at least one of As and Sb.

3. The apparatus as recited in claim 1, wherein the second layer includes at least one of As and Sb.

4. The apparatus as recited in claim 1, wherein the metal includes at least one of Mnand Ni.

5. The apparatus as recited in claim 1, wherein the first layer and the second layer are crystalline.

6. The apparatus as recited in claim 1, wherein the electric field is capacitively applied to the first layer and the second layer.

7. The apparatus as recited in claim 1, wherein the first layer includes GaAs.

8. The apparatus as recited in claim 7, wherein the second layer includes MnAs.

9. The apparatus as recited in claim 1, wherein the apparatus is included in a multilayered device.

10. The apparatus as recited in claim 1, wherein the apparatus includes multiple layers of the first and second layers.

11. A method for varying at least one of magnetization, magneto-optical properties and index of refraction of a thin film comprising the steps of:
   providing an apparatus having ferromagnetic properties including a first layer having the formula III-V, a second layer disposed on the first layer, the second layer including a metal and the V element present in the first layer, said second layer being thick enough to be ferromagnetic; and an electric field device for applying an electric field; and
   applying the electric field to the apparatus to vary at least one of magnetization, magneto-optical properties and index of refraction of the second layer.

12. The method as recited in claim 11, wherein the step of providing includes the step of epitaxially growing the second layer on the first layer.

13. The method as recited in claim 11, wherein the electric field device includes a capacitor and the step of providing includes the step of capacitively applying the electric field.

14. An apparatus having ferromagnetic properties comprising:
   a first layer having the formula III-V; and
   a second layer disposed on the first layer, the second layer including a metal and the V element present in the first layer, said second layer being thick enough to be ferromagnetic such that at least one of magnetization, magneto-optical properties and index of refraction of the second layer are varied by an electric field applied to the apparatus.

15. The apparatus as recited in claim 14, wherein the first layer includes at least one of As and Sb.

16. The apparatus as recited in claim 14, wherein the second layer includes at least one of As and Sb.

17. The apparatus as recited in claim 14, wherein the metal includes at least one of Mn and Ni.

18. The apparatus as recited in claim 14, wherein the first layer and the second layer are crystalline.

19. The apparatus as recited in claim 14, wherein the electric field is capacitively applied to the first layer and the second layer.

20. The apparatus as recited in claim 14, wherein the first layer includes GaAs.

21. The apparatus as recited in claim 20, wherein the second layer includes MnAs.

22. The apparatus as recited in claim 14, wherein the apparatus is included in a multilayered device.

23. The apparatus as recited in claim 14, wherein the apparatus includes multiple layers of the first and second layers.

* * * * *